(12) United States Patent
Jin et al.

(10) Patent No.: US 11,265,498 B2
(45) Date of Patent: Mar. 1, 2022

(54) THREE-DIMENSIONAL IMAGE SENSOR BASED ON TIME OF FLIGHT AND ELECTRONIC APPARATUS INCLUDING THE IMAGE SENSOR

(71) Applicant: SAMSUNG ELECTRONICS CO., LTD., Suwon-si (KR)

(72) Inventors: Young-Gu Jin, Suwon-si (KR); Young-Chan Kim, Seongnam-si (KR); Sung-Ho Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 389 days.

(21) Appl. No.: 16/291,307

(22) Filed: Mar. 4, 2019

(65) Prior Publication Data
US 2020/0029047 A1 Jan. 23, 2020

(30) Foreign Application Priority Data
Jul. 19, 2018 (KR) .................. 10-2018-0084272

(51) Int. Cl.
*H04N 5/3745* (2011.01)
*H01L 27/146* (2006.01)
(Continued)

(52) U.S. Cl.
CPC ....... *H04N 5/37452* (2013.01); *G01S 7/4914* (2013.01); *G01S 17/89* (2013.01); *H01L 27/14601* (2013.01); *H01L 27/14603* (2013.01); *H01L 27/14605* (2013.01); *H01L 27/14607* (2013.01); *H01L 27/14612* (2013.01); *H01L 27/14641* (2013.01); *H01L 27/14643* (2013.01); *H04N 5/3575* (2013.01); *H04N 13/254* (2018.05); *H04N 5/351* (2013.01)

(58) Field of Classification Search
CPC ............ H04N 5/37452; H04N 5/3575; H04N 13/254; H04N 5/351; H04N 13/271; G01S 7/4914; G01S 17/89; G01S 17/894; H01L 27/14601; H01L 27/14641; H01L 27/14605; H01L 27/14643; H01L 27/14603; H01L 27/14607; H01L 27/14612
See application file for complete search history.

(56) References Cited

U.S. PATENT DOCUMENTS 6,825,455 B1 * 11/2004 Schwarte .............. G01S 7/4915
250/214.1
9,083,905 B2 * 7/2015 Wan .................. H04N 5/37452
(Continued)

*Primary Examiner* — Thanh Luu
*Assistant Examiner* — Monica T Taba
(74) *Attorney, Agent, or Firm* — F. Chau & .Associates, LLC

(57) ABSTRACT

A Time-of-Flight (ToF)-based three-dimensional (3D) image sensor includes at least two first photogates symmetrically arranged in a central portion of a pixel, at least two first gates configured to remove an overflow charge generated in the at least two first photogates, and a first gate group. The at least two first gates are arranged symmetrically in an outer portion of the pixel. The first gate group includes a plurality of gates configured to store and transmit charges generated in the at least two first photogates. The first gate group is arranged in the outer portion of the pixel.

20 Claims, 28 Drawing Sheets

(51) Int. Cl.
　　　*G01S 7/4914*　　(2020.01)
　　　*H04N 13/254*　　(2018.01)
　　　*G01S 17/89*　　(2020.01)
　　　*H04N 5/357*　　(2011.01)
　　　*H04N 5/351*　　(2011.01)

(56) References Cited

U.S. PATENT DOCUMENTS

| | | |
|---|---|---|
| 9,210,345 B2 | 12/2015 | Lahav et al. |
| 9,549,140 B2 | 1/2017 | Jung et al. |
| 9,602,742 B2 | 3/2017 | Nam |
| 9,780,138 B2 | 10/2017 | Dupont |
| 9,781,369 B2 | 10/2017 | Kim et al. |
| 2012/0002089 A1* | 1/2012 | Wang ................ H01L 27/14609 348/297 |
| 2014/0084409 A1* | 3/2014 | Nagaraja ........... H01L 27/14654 257/445 |
| 2014/0198183 A1* | 7/2014 | Kim ...................... H04N 5/363 348/46 |
| 2016/0049429 A1 | 2/2016 | Lee et al. |
| 2017/0031025 A1 | 2/2017 | Mase et al. |
| 2017/0194370 A1 | 7/2017 | Mase et al. |
| 2017/0280080 A1 | 9/2017 | Machida et al. |
| 2018/0054573 A1 | 2/2018 | Kumagai |
| 2019/0215471 A1* | 7/2019 | Oh ...................... H01L 27/1464 |

\* cited by examiner

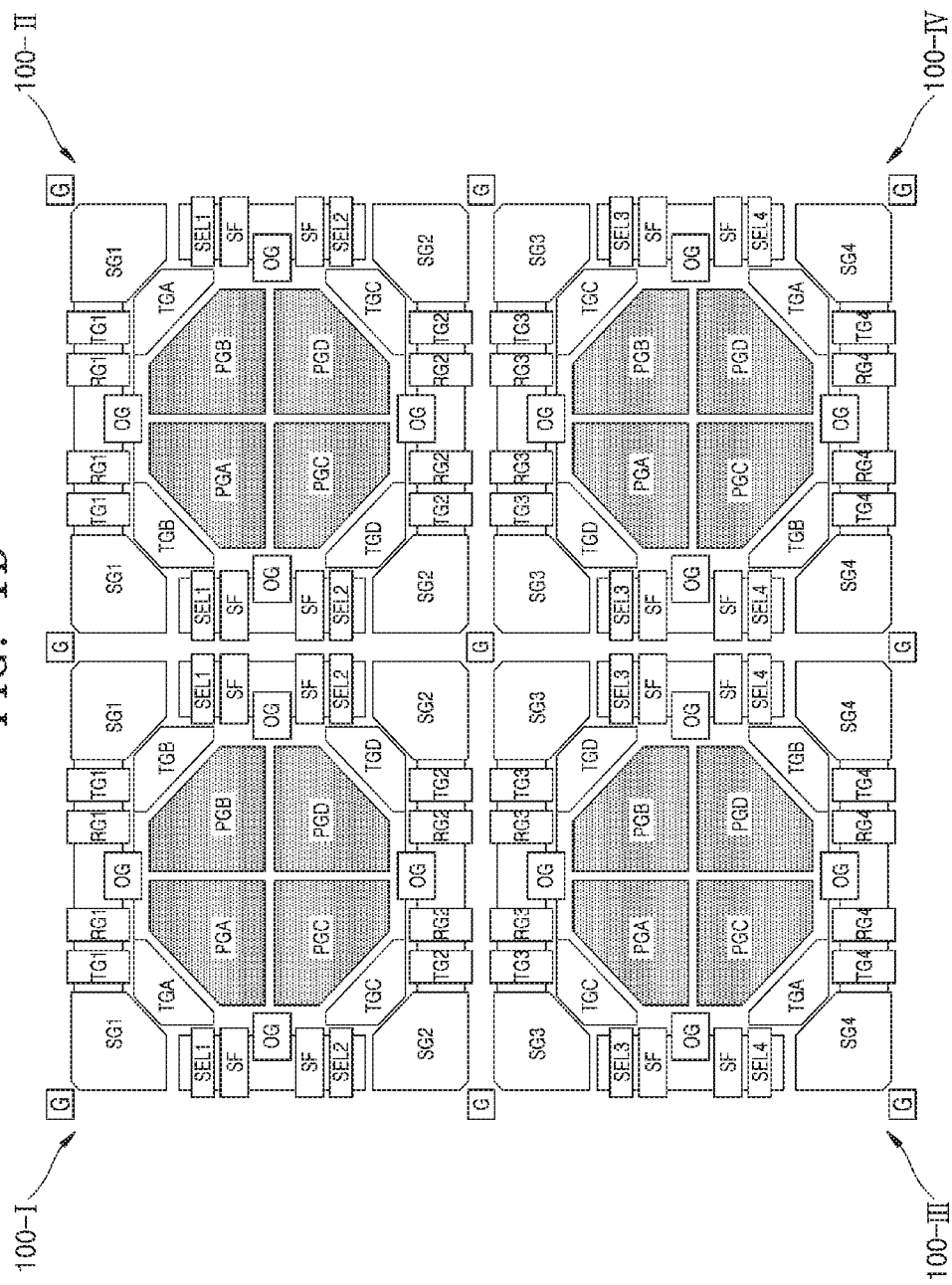

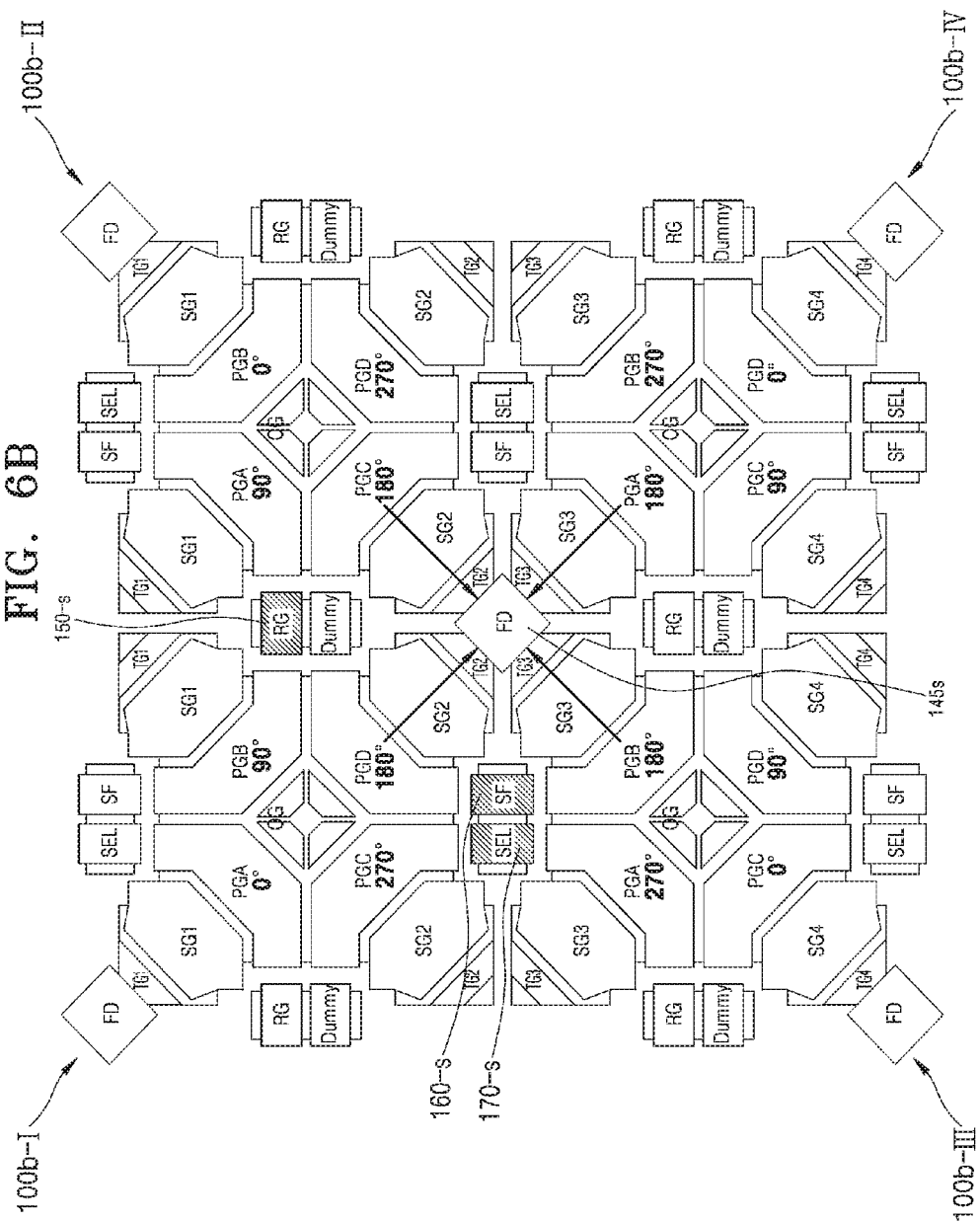

THREE-DIMENSIONAL IMAGE SENSOR BASED ON TIME OF FLIGHT AND ELECTRONIC APPARATUS INCLUDING THE IMAGE SENSOR

CROSS-REFERENCE TO RELATED APPLICATIONS

This application claims priority under 35 U.S.C. § 119 to Korean Patent Application No. 10-2018-0084272, filed on Jul. 19, 2018 in the Korean Intellectual Property Office, the disclosure of which is incorporated by reference herein in its entirety.

TECHNICAL FIELD

Exemplary embodiments of the present inventive concept relate to a three-dimensional (3D) image sensor, and more particularly, to a Time-of-Flight (ToF)-based 3D image sensor and an electronic apparatus including the image sensor.

DISCUSSION OF THE RELATED ART

A ToF-based 3D image sensor may measure a distance to a target object (e.g., an object to be measured) and generate a 3D image of the target object. For example, a ToF-based 3D image sensor may measure the time taken for a pulse-type optical signal emitted from a light source to be reflected by the target object and return to the light source, calculate the distance to the target object, and generate the 3D image of the target object. The optical signal output by the light source may include, for example, a microwave, a light wave, or an ultrasonic wave.

SUMMARY

Exemplary embodiments of the present inventive concept provide a Time-of-Flight (ToF)-based three-dimensional (3D) image sensor including a multi-tap pixel structure, which is less influenced by external light, has excellent tap symmetry, and enables high-speed operations, and an electronic apparatus including the ToF-based 3D image sensor.

According to an exemplary embodiment of the present inventive concept, a ToF-based 3D image sensor includes at least two first photogates symmetrically arranged in a central portion of a pixel, at least two first gates configured to remove an overflow charge generated in the at least two first photogates, and a first gate group. The at least two first gates are arranged symmetrically in an outer portion of the pixel, and the first gate group includes a plurality of gates configured to store and transmit charges generated in the at least two first photogates. The first gate group is arranged in the outer portion of the pixel.

According to an exemplary embodiment of the present inventive concept, a ToF-based 3D image sensor includes at least two photogates symmetrically arranged in a central portion of a pixel, a first gate configured to remove an overflow charge generated in the at least two photogates, and a gate group. The first gate is surrounded by the at least two photogates and is arranged as a symmetrical structure in the central portion of the pixel. The gate group includes a plurality of gates configured to store and transmit charges generated in the at least two photogates. The gate group is arranged in an outer portion of the pixel.

According to an exemplary embodiment of the present inventive concept, a ToF-based 3D image sensor includes at least two first photogates symmetrically arranged in a central portion of a pixel, a first gate configured to emit an overflow charge generated in the at least two first photogates, and a gate group. The first gate is arranged as a symmetrical structure in the central portion or an outer portion of the pixel. The gate group includes a plurality of gates configured to store and transmit charges generated in the at least two first photogates, and is arranged in the outer portion of the pixel.

According to an exemplary embodiment of the present inventive concept, an electronic apparatus includes a light generator configured to generate light and irradiate an object with the generated light, a 3D image sensor configured to receive light reflected by the object and generate charges, and a signal processor configured to process the charges received from the 3D image sensor using a ToF method and to generate a depth image. The 3D image sensor includes at least two first photogates symmetrically arranged in a central portion of a pixel, a first gate configured to emit an overflow charge generated in the at least two first photogates, and a gate group. The first gate is arranged as a symmetrical structure in the central portion of the pixel or an outer portion of the pixel. The gate group includes a plurality of gates configured to store and transmit charges generated in the at least two first photogates. The gate group is arranged in the outer portion of the pixel.

BRIEF DESCRIPTION OF THE DRAWINGS

The above and other features of the present inventive concept will become more apparent by describing in detail exemplary embodiments thereof with reference to the accompanying drawings, in which:

FIG. 1D is a plan view of a structure in which four 4-tap pixels of FIG. 1A are arranged adjacent to one another.

FIG. 6B is a plan view of a structure in which four 4-tap pixels of FIG. 6A are arranged adjacent to one another.

DETAILED DESCRIPTION OF THE EXEMPLARY EMBODIMENTS

Figure 1A:
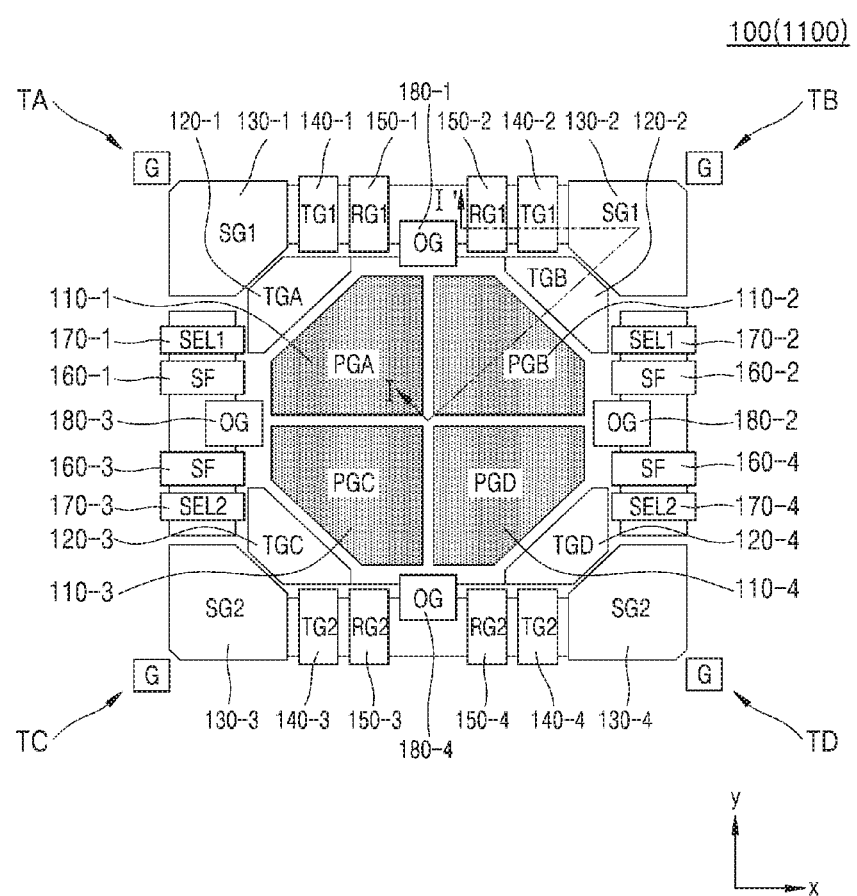
FIG. 1A is a plan view of a 4-tap pixel of a Time-of-Flight (ToF)-based three-dimensional (3D) image sensor according to an exemplary embodiment of the present inventive concept.
Figure 1B:
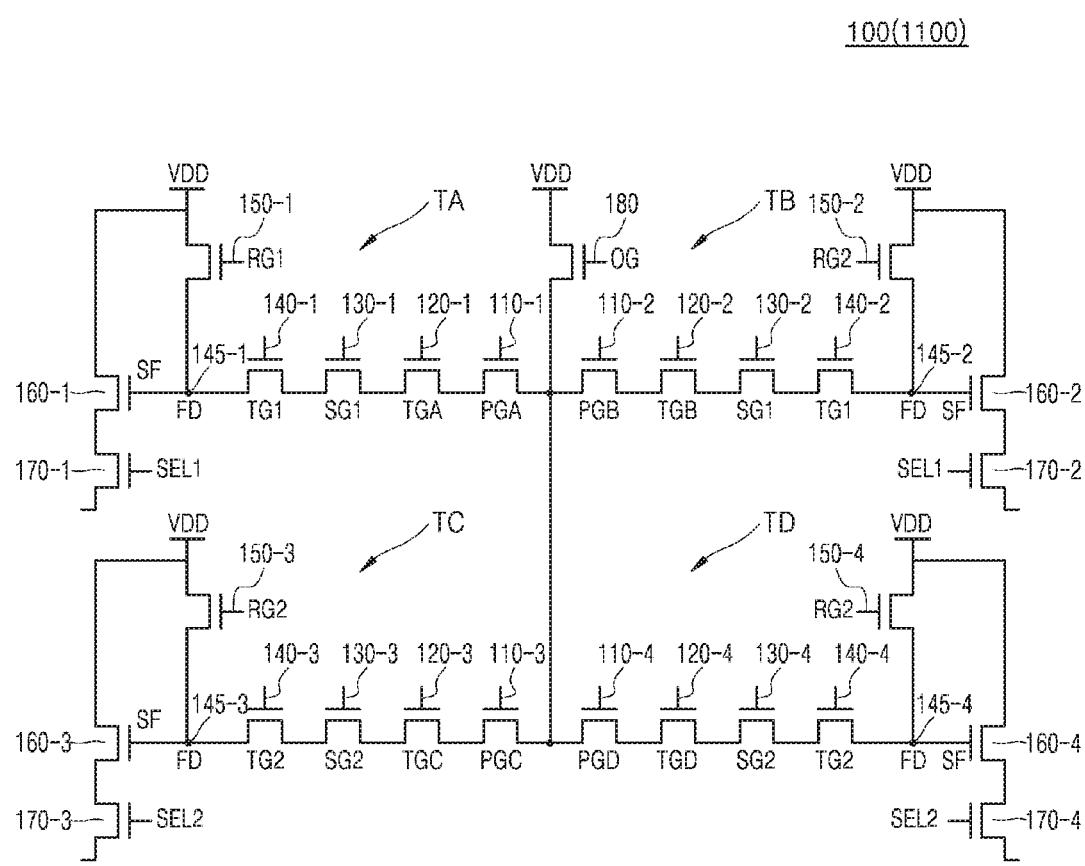
FIG. 1B is an equivalent circuit diagram corresponding to the 4-tap pixel of FIG. 1A.
Figure 1C:
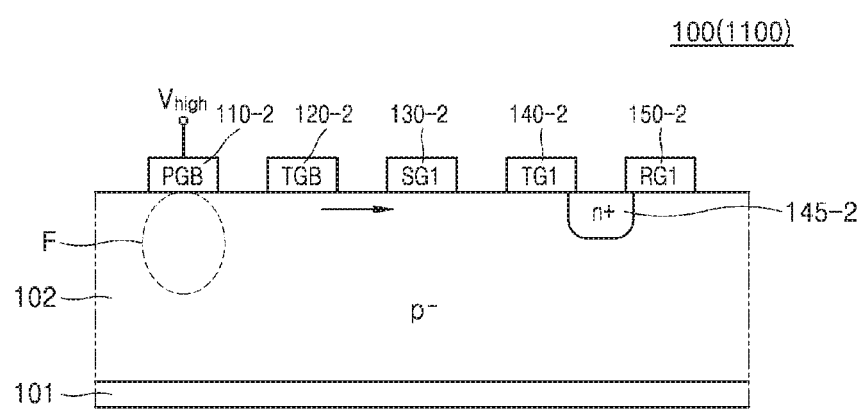
FIG. 1C is a cross-sectional view taken along line I-I' of FIG. 1A.

FIG. 1A is a plan view of a 4-tap pixel of a Time-of-Flight (ToF)-based three-dimensional (3D) image sensor according to an exemplary embodiment of the present inventive concept. FIG. 1B is an equivalent circuit diagram corresponding to the 4-tap pixel of FIG. 1A. FIG. 1C is a cross-sectional view taken along line I-I' of FIG. 1A. FIG. 1D is a plan view of a structure in which four 4-tap pixels of FIG. 1A are arranged adjacent to one another. In FIG. 1B and in other figures that illustrate an equivalent circuit diagram, VDD corresponds to a voltage source.

Referring to FIGS. 1A to 1D, in a ToF-based 3D image sensor (hereinafter, referred to as a '3D image sensor') 1100 according to an exemplary embodiment, a pixel 100 may have a 4-tap pixel structure corresponding to a multi-tap pixel structure. Since the pixel 100 has the 4-tap pixel structure, the 3D image sensor 1100 may perform a fast depth (or distance) sensing operation on an object.

The 3D image sensor 1100 may adopt a global shutter method corresponding to a light burst modulation method of a light generator (refer to 1200 in FIG. 12), and may include an overflow gate 180 (or OG) configured to discharge and remove an overflow charge. The light burst modulation method, which may be a method of generating light with high power in a short amount of time, may minimize or reduce the influence of external light, and minimize or reduce a demodulation operation of a 3D image sensor. The global shutter method, which may be a method of resetting all pixels simultaneously and accumulating optical signals, may be a concept opposite to a rolling shutter method for controlling a pixel operation in row units. The global shutter method may contribute to minimizing or reducing the incidence of external light along with the light burst modulation method. Alternatively, in the light burst modulation method, an overflow charge may be generated due to unnecessary external light while optical signals are read and output. Thus, the 3D image sensor 1100 may include the overflow gate 180 configured to discharge and remove the overflow charge. It is to be understood that the 3D image sensor 1100 is not limited to the light burst modulation method. For example, in exemplary embodiments, the 3D image sensor 1100 may also be applied to a typical light modulation method other than the light burst modulation method.

In the 3D image sensor 1100 according to an exemplary embodiment, the pixel 100 may include sub-pixels TA, TB, TC, and TD corresponding to four taps. Each of the sub-pixels TA, TB, TC, and TD may include a photogate 110 configured to generate charges, storage and transmission gates 120 to 170 configured to store and transmit the charges, and the overflow gate 180 configured to remove an overflow charge. The storage and transmission gates 120 to 170 may include, for example, a tap transfer gate 120, a storage gate 130, a transfer gate 140, a reset gate 150, a source-follower gate 160, and a selection gate 170.

Figure 3:
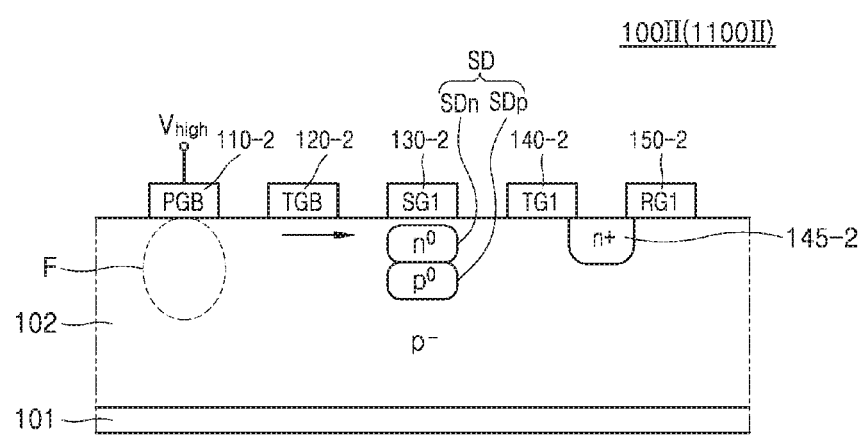
FIG. 3 is a cross-sectional view of a 4-tap pixel of a ToF-based 3D image sensor according to an exemplary embodiment of the present inventive concept, and corresponds to FIG. 1C.

The storage gate 130, which is a charge storage structure, may temporarily store charges before charges are transmitted through the transfer gate 140 to a floating diffusion (FD) region 145. The charge storage structure may be implemented solely as the storage gate 130. As shown in FIG. 3, the charge storage structure may be implemented as a structure in which a storage diode SD is additionally formed under the storage gate 130. As described above, the charge storage structure may be included in the pixel 100 so that a true correlated double sampling (CDS) operation may be enabled and read noise may be minimized or reduced.

Hereinafter, when elements are referred to as being arranged in a 'symmetrical structure', it is to be understood that the elements referred to are symmetrically arranged relative to one another. For example, when two elements are described as being arranged in a symmetrical structure about the x-axis, the two elements may be symmetrically arranged relative to each other about the x-axis.

As shown in FIG. 1A, in exemplary embodiments, the 3D image sensor 1100 includes at least two overflow gates 180 arranged symmetrically in an outer portion of the pixel 100. For example, as shown in FIG. 1A, overflow gates 180-1 and 180-4 are arranged symmetrically in the outer portion of the pixel 100 about the x-axis, and overflow gates 180-2 and 180-3 are arranged symmetrically in the outer portion of the pixel 100 about the y-axis.

Thus, in exemplary embodiments, at least two photogates 110 are symmetrically arranged (e.g., relative to each other) in a central portion of the pixel 100, and at least two overflow gates 180, which are configured to remove an overflow charge generated in the at least two photogates 110, are symmetrically arranged (e.g., relative to each other) in an outer portion of the pixel 100 (e.g., in an outer portion that is outside of the central portion and closer to the periphery of the pixel 100 than the central portion).

For example, in exemplary embodiments, photogates 110-1 and 110-2 are symmetrically arranged (e.g., relative to each other) about the y-axis, photogates 110-1 and 110-3 are symmetrically arranged (e.g., relative to each other) about the x-axis, photogates 110-2 and 110-4 are symmetrically arranged (e.g., relative to each other) about the x-axis, and photogates 110-3 and 110-4 are symmetrically arranged (e.g., relative to each other) about the y-axis. Further, photogates 110-1 and 110-4 are symmetrically arranged (e.g., relative to each other) about the center of the x-y plane, and photogates 110-2 and 110-3 are symmetrically arranged (e.g., relative to each other) about the center of the x-y plane.

Further, overflow gates 180-1 and 180-4 are symmetrically arranged (e.g., relative to each other) about the x-axis, and overflow gates 180-2 and 180-3 are symmetrically arranged (e.g., relative to each other) about the y-axis.

Herein, when elements are described as forming a symmetrical structure about the center of an x-y plane, or as being symmetrically arranged about the center of the x-y plane, it may mean that the elements are formed symmetrically about a diagonal line drawn at an angle about 45 degrees from the x-axis and/or the y-axis (see, e.g., FIG. 1A, in which the portion of the line I-I' drawn through the photogate 110-2 corresponds to such a diagonal line).

In exemplary embodiments, gates other than the photogates 110 and the overflow gates 180 may be collectively referred to as a gate group. Thus, as shown in FIG. 1A, in exemplary embodiments, storage and transmission gates 120 to 170 form a gate group arranged in an outer portion of the pixel 100 (e.g., in an outer portion disposed outside of the central portion in which the photogates 110 may be arranged).

Referring still to FIG. 1A, when the pixel has a 4-tap pixel structure including four photogates 110 (e.g., photogates 110-1, 110-2, 110-3 and 110-4) and four overflow gates 180 (e.g., overflow gates 180-1, 180-2, 180-3 and 180-4), the four photogates 110 and four overflow gates 180 are symmetrically arranged about the center of the pixel 100. Being symmetrically arranged about the center of the pixel may refer to, for example, being symmetrically arranged about the x-axis, about the y-axis, or about the center of the x-y plane. This configuration including a 4-tap pixel structure may be referred to as forming a symmetrical structure about the center of the pixel.

Hereinafter, reference numeral '1' will be used to denote gates included in a first sub-pixel TA, reference numeral '2' will be used to denote gates included in a second sub-pixel TB, reference numeral '3' will be used to denote gates included a third sub-pixel TC, and reference numeral '4' will be used to denote gates included in a fourth sub-pixel TB. For example, the first sub-pixel TA may include a first photogate 110-1 (or PGA), a first tap transfer gate 120-1 (or TGA), a first storage gate 130-1 (or SG1), a first transfer gate 140-1 (or TG1), a first reset gate 150-1 (or RG1), a first source-follower gate 160-1 (or SF), a first selection gate 170-1 (or SEL1), and a first overflow gate 180-1 (or OG). Referring to reference letters PGA, PGB, PGC, and PGD and reference letters TGA TGB, TGC, and TGD, letters A, B, C, and D are used to distinguish taps related to phases from each other. Referring to reference numerals SG1, SG2, TG1, TG2, RG1, RG2, SEL1, and SEL2, numbers 1 and 2 are used to distinguish gates of sub-pixels of the same row, which operate together, from gates of sub-pixels of other rows. However, since the source-follower gate SF operates due to a voltage of the FD region 145 and not due to application of an external voltage, the source-follower gate SF is not distinguished by a separate reference numeral.

For reference, a tap structure of the pixel 100 may depend on the number of taps that may distinguish the generated charges by phase and transmit the distinguished charges to the charge storage structure. The tap structure of the pixel 100 may typically be classified as a 1-tap structure, 2-tap structure, or a 4-tap structure. The 1-tap structure may be based on a method of transmitting charges to the charge storage structure using one tap with respect to each of phases 0°, 90°, 180°, and 270°. The 2-tap structure may be based on a method of transmitting charges to the charge storage structure using two taps with respect to phases 0° and 180° and with respect to phases 90° and 270°. The 4-tap structure may be based on a method of transmitting charges to the charge storage structure using four taps with respect to all phases. The 1-tap structure may utilize four sensing operations to correspond to each phase, the 2-tap structure may utilize two sensing operations to correspond to each phase, and the 4-tap structure may utilize only one sensing operation to correspond to each phase. Accordingly, the 2-tap structure and the 4-tap structure may operate at higher speeds than the 1-tap structure. Herein, pixels having the 2-tap structure and the 4-tap structure will be referred to as multi-tap pixel structures.

A function of a tap may be implemented by a photogate or a tap transfer gate. For example, the photogate may implement the function of the tap by generating charges and directly transmitting the charges to a charge storage structure. In this structure, a tap structure may be determined by the number of photogates. In exemplary embodiments, a photodiode may be utilized instead of the photogate, and a tap transfer gate configured to transmit charges generated by the photodiode to a charge storage structure may be arranged separately from the photodiode. In this structure, a tap structure may be determined by the number of tap transfer gates.

It is to be understood that a pixel according to exemplary embodiments is not limited to the above-described two tap structures and may have various tap structures. For example, as in the ToF-based 3D image sensor 1100 shown in FIG. 1A, the pixel 100 may include four photogates 110 and four tap transfer gates 120 corresponding thereto. In this case, the pixel 100 may correspond to a 4-tap pixel structure. The tap transfer gate 120 may support a global shutter function. As can be seen from the circuit diagram of FIG. 2A, a pixel 100I may include a photogate 110 and a photodiode 190, and a tap transfer gate 120 corresponding to the photogate 110 and the photodiode 190. In this case, the pixel 100I may also correspond to a 4-tap pixel structure. A structure including both the photogate 110 and the photodiode 190 will be described in further detail below with reference to FIGS. 2A and 2B.

In the ToF-based 3D image sensor 1100 of an exemplary embodiment, the sub-pixels TA, TB, TC, and TD of the pixel 100 may have a symmetrical structure on an x-y plane, as shown in FIGS. 1A and 1D. For example, assuming that the x-y plane is divided into four quadrants along an x-axis and a y-axis, as shown in FIG. 1A, the first sub-pixel TA may be arranged in a second quadrant, the second sub-pixel TB may be arranged in a first quadrant, the third sub-pixel TC may be arranged in a third quadrant, and the fourth sub-pixel TD may be arranged in a fourth quadrant, and the gates included in each of the first to fourth sub-pixels TA, TB, TC, and TD may have a symmetrical structure about a center of the x-y plane.

For example, assuming that the first sub-pixel TA corresponds to a tap having a phase of 0°, the fourth sub-pixel TD may correspond to a tap having a phase of 180°, and the gates included in each of the first sub-pixel TA and the fourth sub-pixel TD may be symmetrical about the center of the x-y plane. For example, the first photogate 110-1 (or PGA) and the fourth photogate 110-4 (or PGD) may be arranged adjacent to a center of the x-y plane in the second quadrant and in the fourth quadrant, respectively. The first storage gate 130-1 (or SG1) and the fourth storage gate 130-4 (or SG2) may be arranged at an outer corner portion of the second quadrant and an outer corner portion of the fourth quadrant, respectively. The first tap transfer gate 120-1 (or TGA) and the fourth tap transfer gate 120-4 (or TGD) may be respectively arranged between the first photogate 110-1

(or PGA) and the first storage gate 130-1 (or SG1) and between the fourth photogate 110-4 (or PGD) and the fourth storage gate 130-4 (or SG2). The first transfer gate 140-1 (or TG1) and the first reset gate 150-1 (or RG1) may be arranged on an upper side of the second quadrant in an x direction, and the fourth transfer gate 140-4 (or TG2) and the fourth reset gate 150-4 (or RG2) may be arranged on a lower side of the fourth quadrant in the x direction.

Further, the first selection gate 170-1 (or SEL1) and the first source-follower gate 160-1 (or SF) may be arranged on a left side of the second quadrant in a y direction, and the fourth selection gate 170-4 (or SEL2) and the fourth source-follower gate 160-4 (or SF) may be arranged on a right side of the fourth quadrant in a y direction. The first overflow gate 180-1 (or OG) may be arranged outside the photogate 110 between the first quadrant and the second quadrant, and the fourth overflow gate 180-4 (or OG) may be arranged outside the photogate 110 between the third quadrant and the fourth quadrant. As a result, according to exemplary embodiments, the gates of the first sub-pixel TA may be symmetric to the gates of the fourth sub-pixel TD about the center of the x-y plane, and the gates of the second sub-pixel TB may be symmetric to the gates of the third sub-pixel TC about the center of the x-y plane.

FIG. 1C illustrates a path through which charges generated in a second photogate 110-2 move. When a high voltage $V_{high}$ is applied to the second photogate 110-2, a field F may be formed in a well region 102 arranged on a semiconductor substrate 101, and light incident through a rear surface of the semiconductor substrate 101 may be converted into electron-hole pairs near the field F to generate charges. The well region 102 may be, for example, a P⁻type region. The charges (e.g., electrons) generated in the second photogate 110-2 may be transmitted through a second tap transfer gate 120-2 to a second storage gate 130-2, temporarily stored, and transmitted through a second transfer gate 140-2 to a second FD region 145-2. Holes may be discharged through a ground G arranged in an outer portion of the pixel 100 of FIG. 1A.

The 3D image sensor 1100 may include a pixel portion and a peripheral circuit portion, and a plurality of pixels 100 may be arranged to form a two-dimensional (2D) array structure in the pixel portion. FIG. 1D illustrates a portion of the 2D array structure of the pixels 100, in which four adjacent pixels 100-I, 100-II, 100-III, and 100-IV are arranged. The peripheral circuit portion may be arranged in the vicinity of the pixel portion and include a row drive circuit, a column signal processing circuit, an image buffer memory, an output circuit, and a control circuit.

Since the pixel 100 includes the 4-tap pixel structure and the overflow gate 180, the 3D image sensor 1100 may adopt the light burst modulation method. As a result, the influence of external light may be minimized or reduced, and a demodulation operation time may be minimized or reduced. In the 3D image sensor 1100 according to an exemplary embodiment, the photogate 110, the storage and transmission gates 120 to 170, and the overflow gate 180 of the pixel 100 may have a symmetrical structure to realize tap symmetry. Thus, balanced transmission of signals between sub-pixels may be achieved to obtain excellent signal transmission characteristics without distortion or deformation of signals, resulting in accurate 3D images of an object. Furthermore, the 3D image sensor 1100 according to an exemplary embodiment may include the charge storage structure between the photogate 110 and the transfer gate 140. As a result, a true CDS operation that minimizes or reduces read noise may be enabled.

Figure 2A:
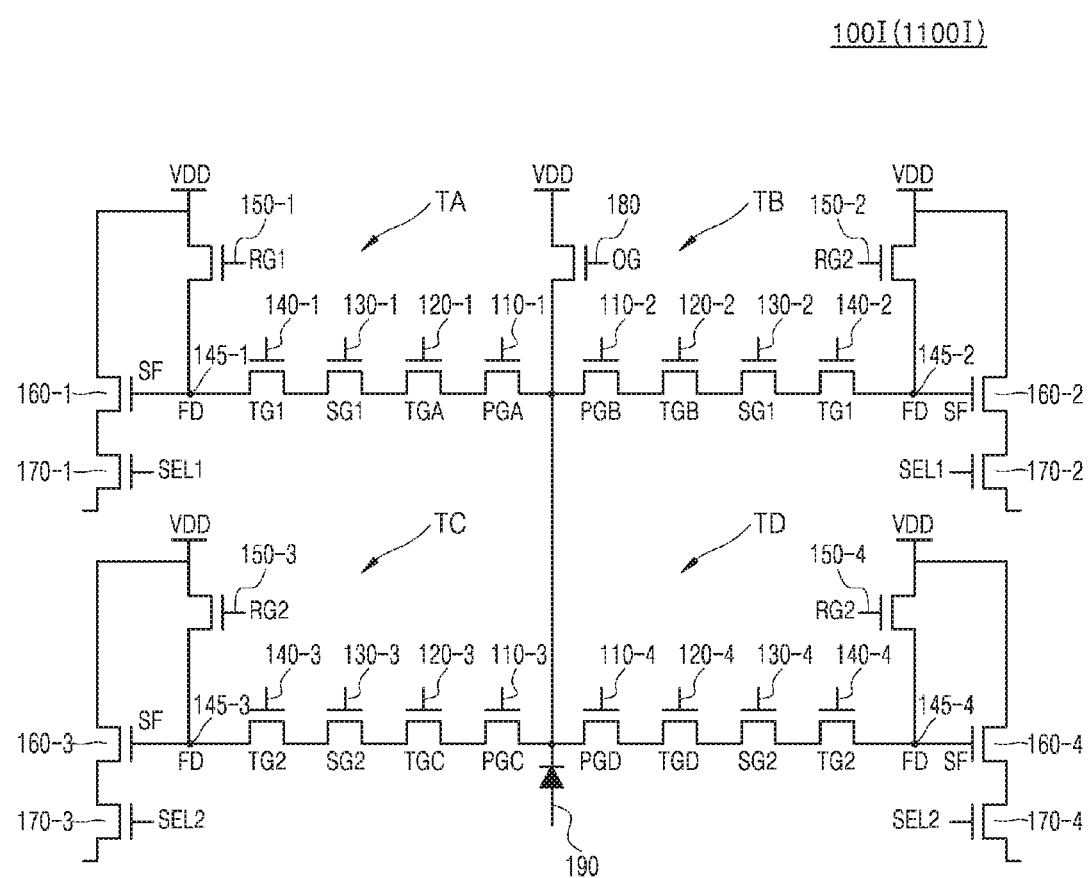
FIG. 2A is an equivalent circuit diagram corresponding to a 4-tap pixel of a ToF-based 3D image sensor according to an exemplary embodiment of the present inventive concept.
Figure 2B:
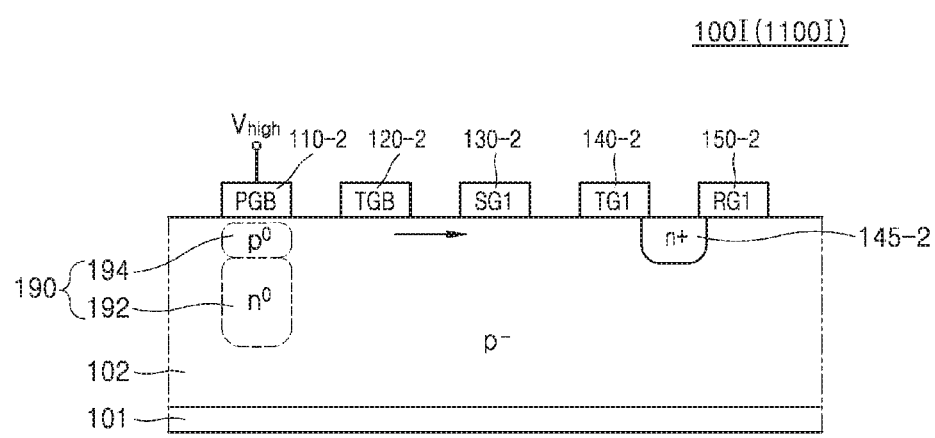
FIG. 2B is a cross-sectional view of the 4-tap pixel of FIG. 2A, and corresponds to FIG. 1C.

FIG. 2A is an equivalent circuit diagram corresponding to a 4-tap pixel of a ToF-based 3D image sensor according to an exemplary embodiment of the present inventive concept. FIG. 2B is a cross-sectional view of the 4-tap pixel of FIG. 2A, and corresponds to FIG. 1C. For convenience of explanation, a further description of elements and technical aspects previously described with reference to FIGS. 1A to 1D may only be briefly presented or may be omitted.

Referring to FIGS. 2A and 2B, a 3D image sensor 1100I according to an exemplary embodiment may differ from the 3D image sensor 1100 of FIG. 1A in that the pixel 100I further includes a photodiode 190. For example, in the 3D image sensor 1100I according to an exemplary embodiment, the photodiode 190 may be formed under a photogate 110. The photodiode 190 may be formed, for example, by doping a well region 102 arranged under the photogate 110. For example, the photodiode 190 may include an n⁰-region 192 and a p⁰-region 194. By forming the photodiode 190 under the photogate 110 as described above, a field may be formed relatively deeply. Accordingly, in the 3D image sensor 1100I, more charges may be generated through the photogate 110 and the photodiode 190.

A plan view of the pixel 100I of the 3D image sensor 1100I shown in FIGS. 2A and 2B may be substantially the same as a plan view of the pixel 100 of the 3D image sensor 1100 of FIG. 1A. For example, since the photodiode 190 is formed under the photogate 110, the photodiode 190 is not visible in the plan view. In addition, although FIG. 2B illustrates a case in which one photodiode 190 is formed to correspond to a second photogate 110-2, exemplary embodiments are not limited thereto. For example, in exemplary embodiments, one photodiode 190 may be formed over four photogates 110-1, 110-2, 110-3, and 110-4.

FIG. 3 is a cross-sectional view of a 4-tap pixel of a ToF-based 3D image sensor according to an exemplary embodiment of the present inventive concept, and corresponds to FIG. 1C. For convenience of explanation, a further description of elements and technical aspects previously described with reference to FIGS. 1A to 2B may only be briefly presented or may be omitted.

Referring to FIG. 3, a 3D image sensor 1100II according to an exemplary embodiment may differ from the 3D image sensor 1100 of FIG. 1A in that a pixel 100II further includes a storage diode SD. For example, in the 3D image sensor 1100II, the storage diode SD may be formed in a well region 102 arranged under a second storage gate 130-2. The storage diode SD may include an n⁰-region SDn and a p⁰-region SDp, which are arranged in an upper portion and a lower portion thereof.

In the 3D image sensor 1100 of FIG. 1A, only the storage gate 130 may implement a charge storage function. However, in the 3D image sensor 1100II of FIG. 3, a storage gate 130 and the storage diode SD may implement a charge storage function together. Thus, the 3D image sensor 1100II according to an exemplary embodiment may improve the charge storage function. In exemplary embodiments, the storage gate 130 may be omitted, and only the storage diode SD may be formed. In such a structure, the storage diode SD may solely implement a charge storage function.

Figure 4A:
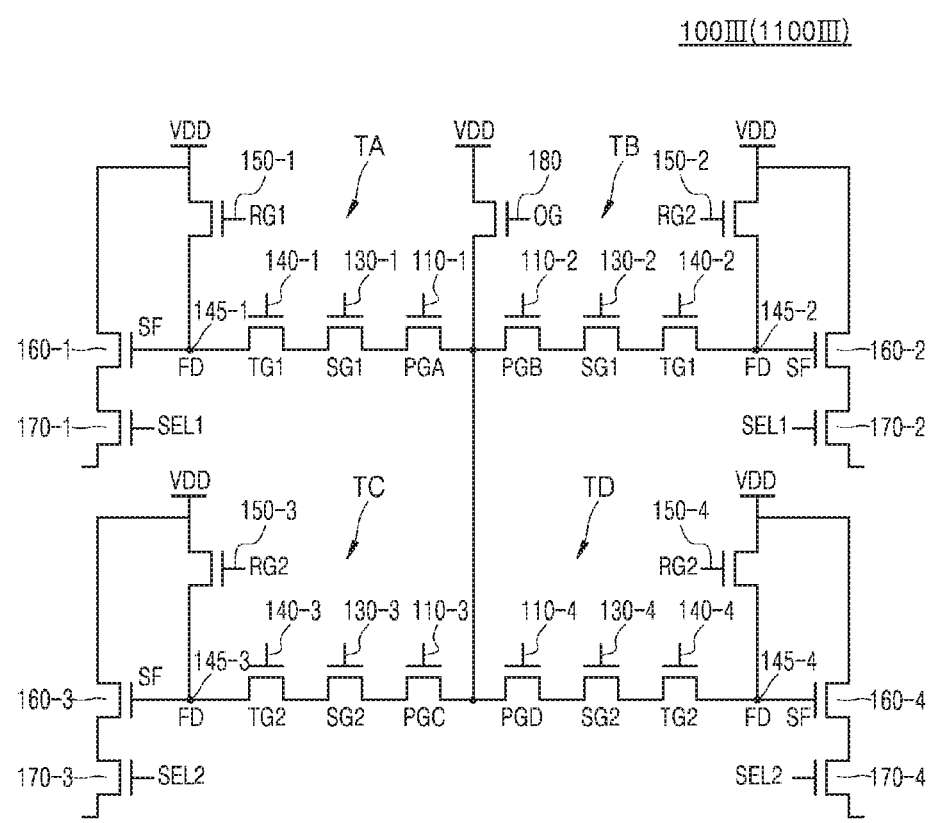
FIG. 4A is an equivalent circuit diagram corresponding to a 4-tap pixel of a ToF-based 3D image sensor according to an exemplary embodiment of the present inventive concept.
Figure 4B:
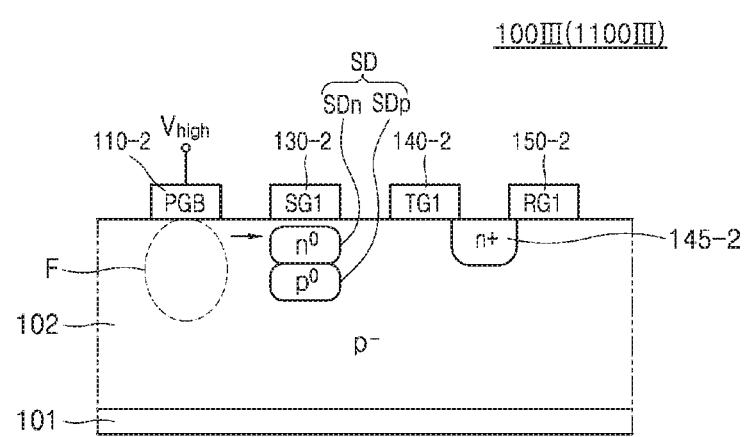
FIG. 4B is a cross-sectional view of the 4-tap pixel of FIG. 4A, and corresponds to FIG. 1C.

FIG. 4A is an equivalent circuit diagram corresponding to a 4-tap pixel of a ToF-based 3D image sensor according to an exemplary embodiment of the present inventive concept. FIG. 4B is a cross-sectional view of the 4-tap pixel of FIG. 4A, and corresponds to FIG. 1C. For convenience of explanation, a further description of elements and technical aspects previously described with reference to FIGS. 1A to 3 may only be briefly presented or may be omitted.

Referring to FIGS. 4A and 4B, a 3D image sensor 1100III according to an exemplary embodiment may differ from the 3D image sensor 1100II of FIG. 3 in that a pixel 100III does not include a tap transfer gate. For example, in the 3D image sensor 1100III of FIGS. 4A and 4B, a storage diode SD may be formed in a well region 102 arranged under a second storage gate 130-2 as in the 3D image sensor 1100II of FIG. 3. In exemplary embodiments, a tap transfer gate is not present between a second photogate 110-2 and the second storage gate 130-2. When the storage diode SD is formed under a storage gate 130, the storage gate 130 may implement a function of the tap transfer gate. For example, the storage gate 130 may function to support a global shutter.

A charge storage structure and a tap transfer gate will now be briefly described considering the 3D image sensors 1100, 1100I, 1100II, and 1100III of FIGS. 1A to 4B. The charge storage structure may have any one of i) a structure including only the storage gate 130, ii) a structure including only the storage diode SD, and iii) a combined structure including both the storage gate 130 and the storage diode SD. The tap transfer gate may be selectively included in the combined structure including both the storage gate 130 and the storage diode SD. For example, since the storage gate 130 functions as a tap transfer gate in the combined structure, the tap transfer gate may be omitted. However, according to exemplary embodiments, when only the storage gate 130 is included or only the storage diode SD is included, the tap transfer gate is also included.

Referring to the 3D image sensors 1100II and 1100III of FIGS. 3 and 4B, although only the second photogate 110-2 is illustrated in the pixels 100II and 100III, structures of the pixels 100II and 100III are not limited thereto. For example, according to exemplary embodiments, in the 3D image sensors 1100II and 1100III of FIGS. 3 and 4B, each of the pixels 100II and 100III may include a photodiode formed under the photogate 110.

Figure 5A:
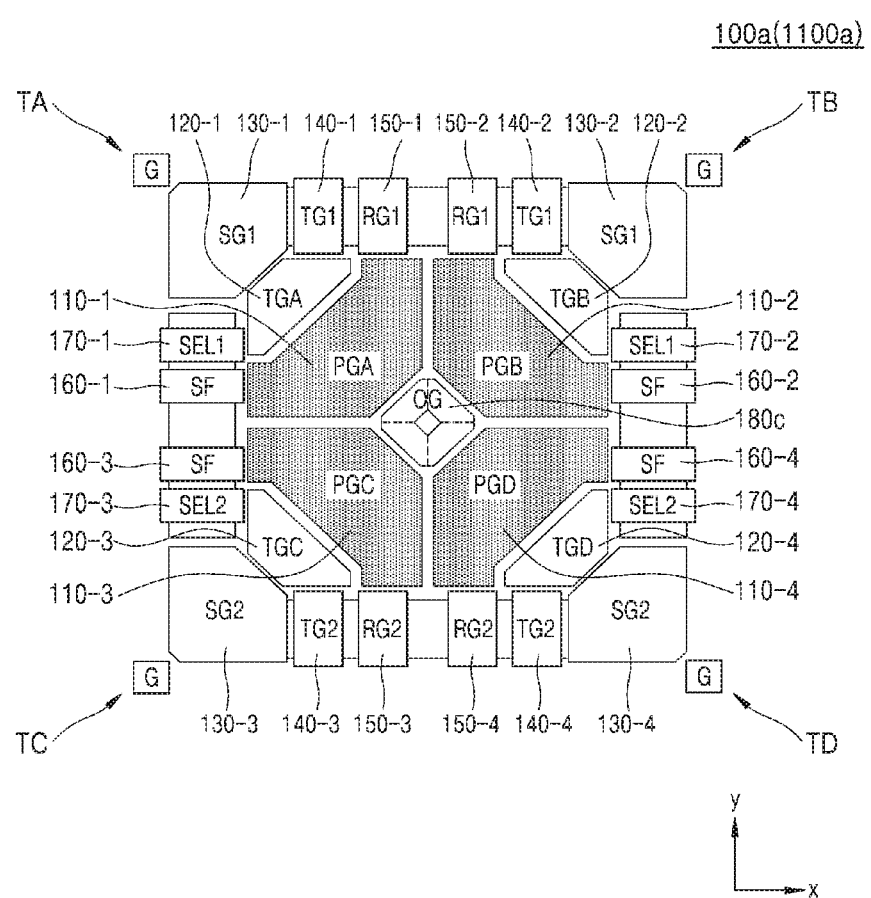
FIG. 5A is a plan view of a 4-tap pixel of a ToF-based 3D image sensor according to an exemplary embodiment of the present inventive concept.
Figure 5B:
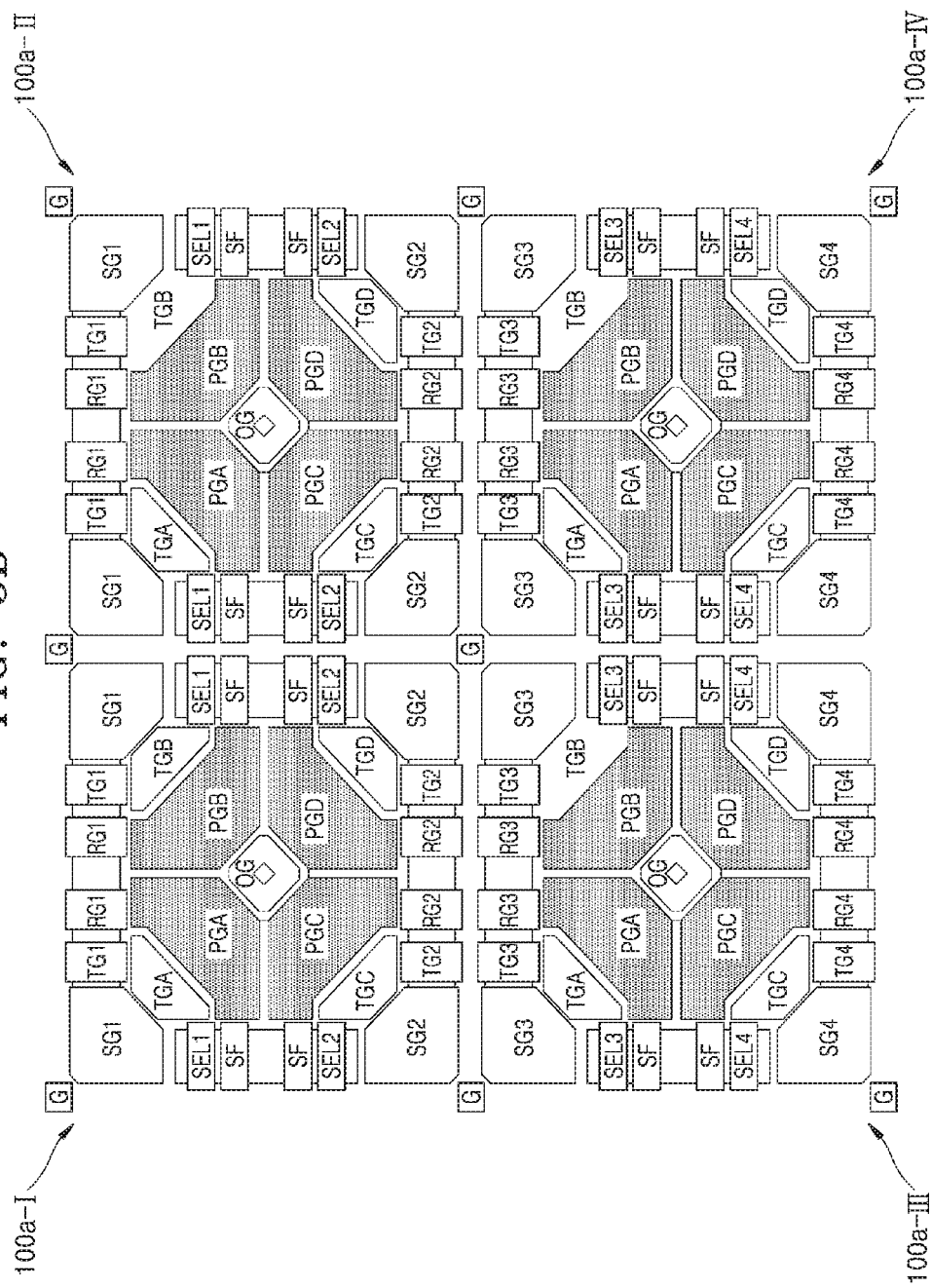
FIG. 5B is a plan view of a structure in which four 4-tap pixels of FIG. 5A are arranged adjacent to one another.

FIG. 5A is a plan view of a 4-tap pixel of a ToF-based 3D image sensor according to an exemplary embodiment of the present inventive concept. FIG. 5B is a plan view of a structure in which four 4-tap pixels of FIG. 5A are arranged adjacent to one another. For convenience of explanation, a further description of elements and technical aspects previously described with reference to FIGS. 1A to 4B may only be briefly presented or may be omitted.

Referring to FIGS. 5A and 5B, a 3D image sensor 1100a according to an exemplary embodiment may differ from the 3D image sensor 1100 of FIG. 1A in that an overflow gate 180c is arranged in a central portion of an x-y plane in a pixel 100a. For example, in the 3D image sensor 1100a of FIGS. 5A and 5B, sub-pixels TA, TB, TC, and TD corresponding to four taps may be arranged in four quadrants of the x-y plane. Photogates 110 and storage and transmission gates 120 to 170, which are included in the respective sub-pixels TA, TB, TC, and TD, may be arranged to have a symmetrical structure about a center of the x-y plane.

In the 3D image sensor 1100a of FIGS. 5A and 5B, the overflow gate 180c may be arranged in a center of the pixel 100a, (e.g., near the center of the x-y plane). Thus, the overflow gate 180c may be surrounded by four photogates 110-1, 110-2, 110-3, and 110-4. In FIG. 5A, the overflow gate 180c is divided into four portions by dashed lines, which may indicate that one overflow gate 180c has a symmetrical structure about the center of the x-y plane. In exemplary embodiments, one overflow gate 180c may be formed in the center of the x-y plane, and a structure of a gate electrode may be formed on a substrate to be symmetrical about the center of the x-y plane. For example, as shown in FIG. 5A, the overflow gate 180c may have a coaxial annular shape having a hollow central portion.

FIG. 5B illustrates a portion of a 2D array structure of pixels 100a, that is, a structure in which four adjacent pixels 100a-I, 100a-II, 100a-III, and 100a-IV are arranged, in the 3D image sensor 1100a of FIG. 5A.

Figure 6A:
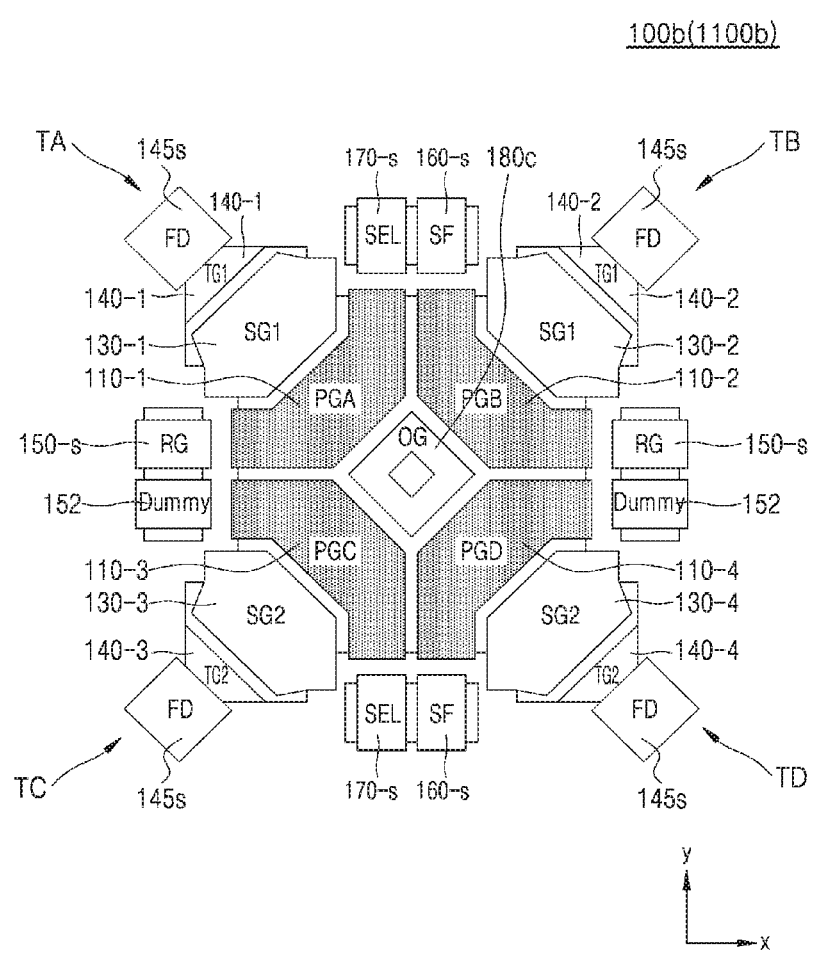
FIG. 6A is a plan view of a 4-tap pixel of a ToF-based 3D image sensor according to an exemplary embodiment of the present inventive concept.
Figure 6C:
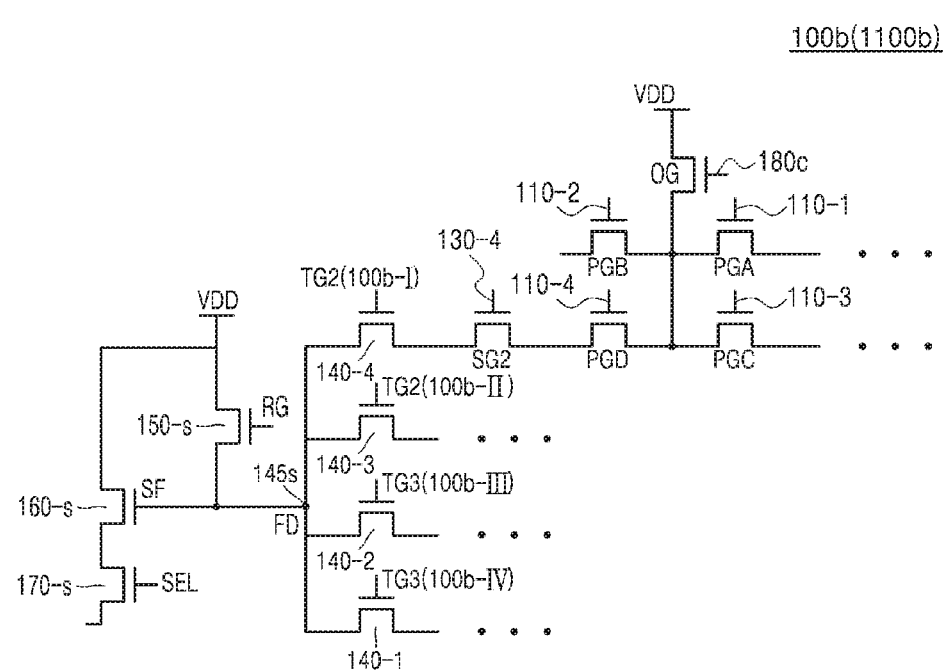
FIG. 6C is an equivalent circuit diagram of a portion of the structure of FIG. 6B.

FIG. 6A is a plan view of a 4-tap pixel of a ToF-based 3D image sensor according to an exemplary embodiment of the present inventive concept. FIG. 6B is a plan view of a structure in which four 4-tap pixels of FIG. 6A are arranged adjacent to one another. FIG. 6C is an equivalent circuit diagram of a portion of the structure of FIG. 6B. For convenience of explanation, a further description of elements and technical aspects previously described with reference to FIGS. 1A to 5B may be only briefly presented or may be omitted.

Referring to FIGS. 6A to 6C, in a 3D image sensor 1100b according to an exemplary embodiment of the present inventive concept, a pixel 100b may include four sub-pixels TA, TB, TC, and TD. Of storage and transmission gates, a reset gate 150-s, a source-follower gate 160-s, and a selection gate 170-s may be shared among the corresponding sub-pixels of four pixels 100b-I, 100b-II, 100b-III, and 100b-IV. For example, in the 3D image sensor 1100b of FIGS. 6A to 6C, the sub-pixels TA, TB, TC, and TD of the pixel 100b and photogates 110-1, 110-2, 110-3, and 110-4, storage gates 130-1, 130-2, 130-3, and 130-4, and transfer gates 140-1, 140-2, 140-3, and 140-4, which correspond to the sub-pixels TA, TB, TC, and TD of the pixel 100b, may be arranged as a symmetrical structure in four quadrants of an x-y plane. For convenience of explanation, the illustration of tap transfer gates is omitted in FIGS. 6A to 6C. As described with reference to FIGS. 3 to 4B, the tap transfer gates may or may not be included in the pixel 100b according to exemplary embodiments of the present inventive concept.

An overflow gate 180c may be arranged in a center of the x-y plane and surrounded by the photogates 110-1, 110-2, 110-3, and 110-4, as in the 3D image sensor 1100a of FIG. 5A. However, overflow gates are not limited thereto, and may be symmetrically arranged between two quadrants outside the photogates 110-1, 110-2, 110-3, and 110-4, as in the 3D image sensor 1100 of FIG. 1A.

The reset gates 150-s may be arranged in outer portions of both side surfaces of the pixel 100b in the x direction. The source-follower gates 160-s and the selection gates 170-s may be arranged in outer portions of upper and lower portions of the pixel 100b in the y direction. A dummy gate 152 may be arranged under the reset gate 150-s in the y direction. In exemplary embodiments, the dummy gate 152 may be omitted.

In exemplary embodiments, the reset gate 150-s, the source-follower gate 160-s, and the selection gate 170-s are not arranged one by one to correspond to each of the sub-pixels TA, TB, TC, and TD, but rather, are arranged to be shared among the corresponding sub-pixels of four pixels. An FD region 145s may also be arranged to be shared among the corresponding sub-pixels of four pixels. For example, as can be seen in FIGS. 6B and 6C, the FD region 145s located in the center may be shared among sub-pixels TD, TC, TB, and TA of four pixels 100b-I, 100b-II, 100b-III, and 100b-IV. The sub-pixels TD, TC, TB, and TA, which share the FD region 145s with one another, may correspond to a tap having the same phase, for example, a phase of 180°.

The reset gate 150-s arranged above the FD region 145s may be connected to the FD region 145s and shared among the sub-pixels TD, TC, TB, and TA, and the source-follower gate 160-s and the selection gate 170-s arranged on the left side of the FD region 145s may be shared among the sub-pixels TD, TC, TB, and TA in FIG. 6B. In exemplary embodiments, positions of the reset gate 150-s, the source-follower gate 160-s, and the selection gate 170-s, which are shared among the sub-pixels TD, TC, TB, and TA, may be changed. For example, the reset gate 150s, which is arranged below the FD region 145s, and the source-follower gate 160-s and the selection gate 170-s, which are arranged on the right side of the FD region 145s, may be shared among the sub-pixels TD, TC, TB, and TA.

Figure 7A:
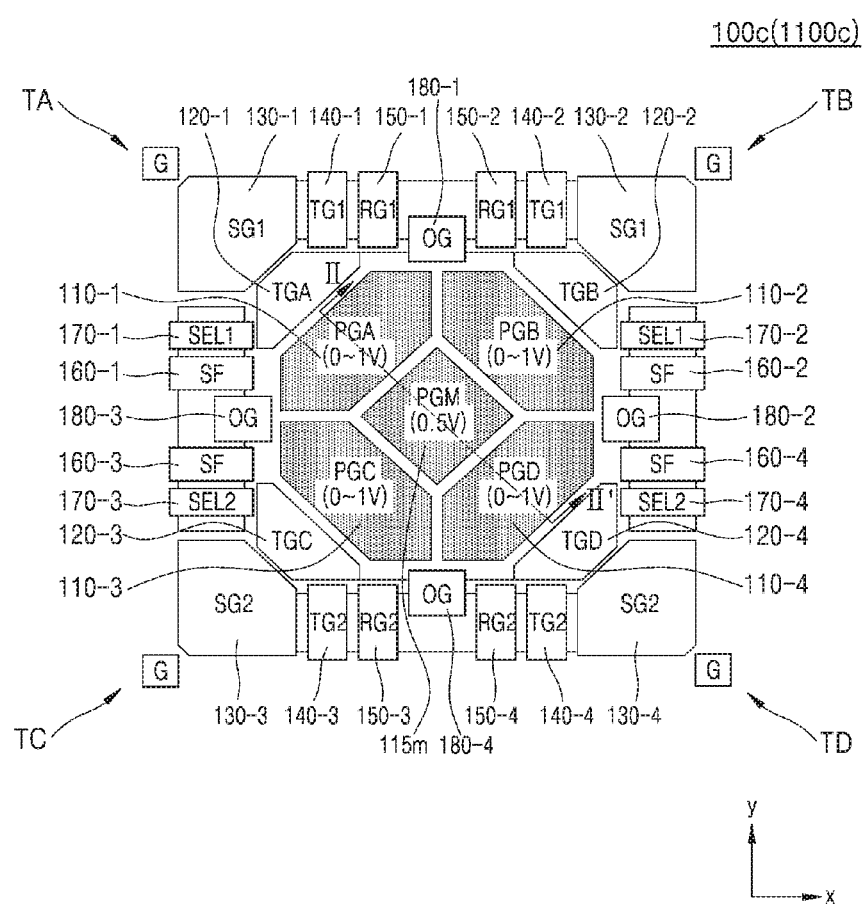
FIG. 7A is a plan view of a 4-tap pixel of a ToF-based 3D image sensor according to an exemplary embodiment of the present inventive concept.
Figure 7B:
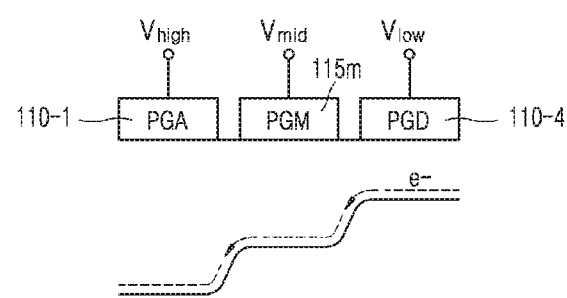
FIG. 7B is a cross-sectional view taken along line II-II' of FIG. 7A.

FIG. 7A is a plan view of a 4-tap pixel of a ToF-based 3D image sensor according to an exemplary embodiment of the present inventive concept. FIG. 7B is a cross-sectional view taken along line II-II' of FIG. 7A. For convenience of explanation, a further description of elements and technical aspects previously described with reference to FIGS. 1A to 6C may be only briefly presented or may be omitted.

Referring to FIGS. 7A and 7B, a 3D image sensor 1100c according to an exemplary embodiment of the present inventive concept may differ from the 3D image sensor 1100 of FIG. 1A, in that a pixel 100c further includes a middle photogate 115m arranged in a central portion thereof. For example, in the 3D image sensor 1100c of FIGS. 7A and 7B, a photogate 110, storage and transmission gates 120 to 170, and an overflow gate 180 may be arranged in the pixel 100c to have similar structures to those of the 3D image sensor 1100 of FIG. 1A. However, unlike the 3D image sensor 1100 of FIG. 1A, the middle photogate 115m may be arranged in the central portion of the pixel 100c and surrounded by four photogates 110-1, 110-2, 110-3, and 110-4.

A voltage having a middle level between a high voltage and a low voltage applied to the photogate 110 may be applied to the middle photogate 115m. For example, when the high voltage applied to the photogate 110 is about 1 V and the low voltage applied to the photogate 110 is about 0 V, a voltage of about 0.5 V may be applied to the middle photogate 115m. It is to be understood that the high voltage and the low voltage applied to the photogate 110 and the voltage having the middle level applied to the middle photogate 115m are not limited to the above-described numerical values.

FIG. 7B illustrates the effects of the arrangement of the middle photogate 115m. When a high voltage $V_{high}$ is applied to the first photogate 110-1, a low voltage $V_{low}$ is applied to the fourth photogate 110-4, and a voltage $V_{mid}$ having a middle level is applied to the middle photogate 115m. As a result, an energy level may be formed as shown in FIG. 7B. Thus, the migration of charges (e.g., electrons) may be promoted to improve signal characteristics.

Figure 8A:
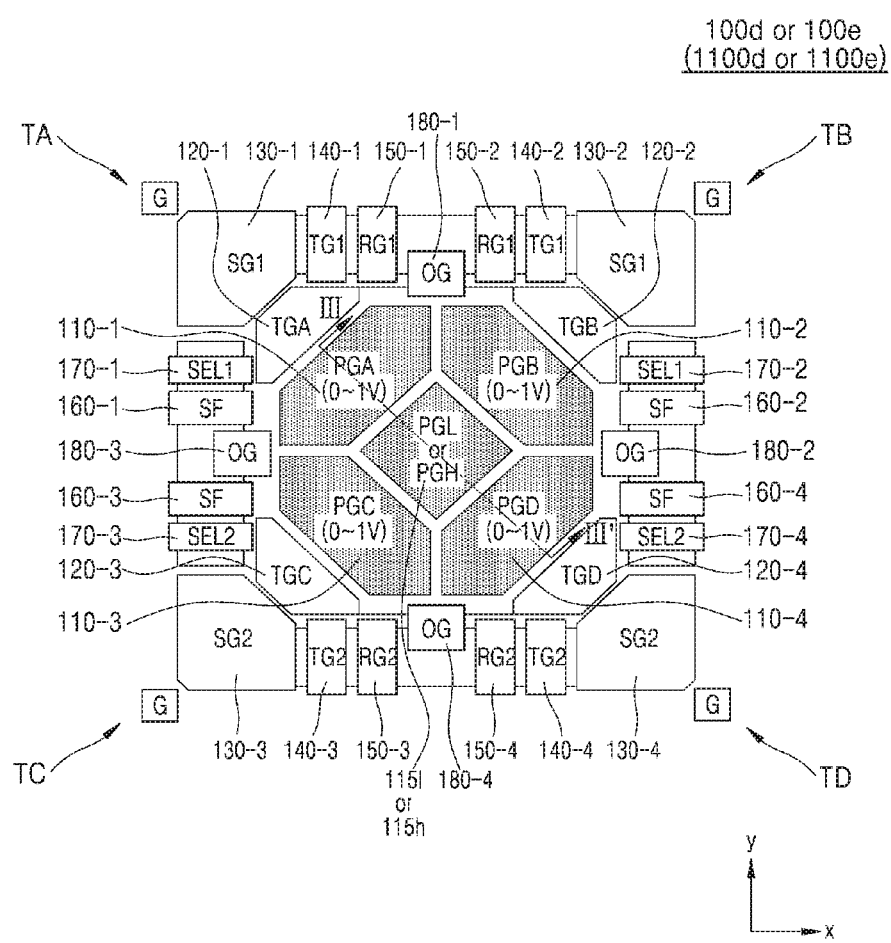
FIG. 8A is a plan view of a 4-tap pixel of a ToF-based 3D image sensor according to an exemplary embodiment of the present inventive concept.
Figure 8B:
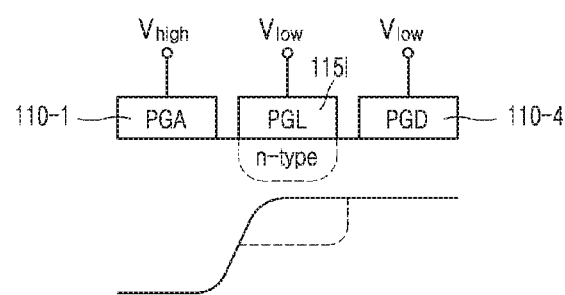
FIGS. 8B and 8C are cross-sectional views taken along line III-III' of FIG. 8A.
Figure 8C:
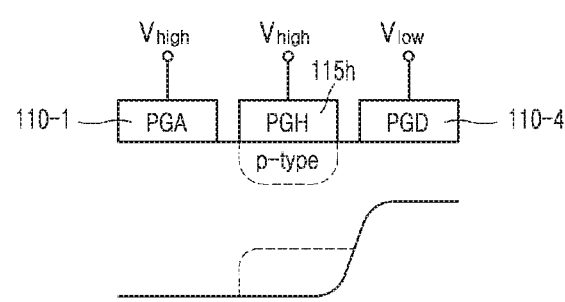

FIG. 8A is a plan view of a 4-tap pixel of a ToF-based 3D image sensor according to an exemplary embodiment of the present inventive concept. FIGS. 8B and 8C are cross-sectional views taken along line III-III' of FIG. 8A. For convenience of explanation, a further description of elements and technical aspects previously described with reference to FIGS. 1A to 7C may be only briefly presented or may be omitted.

Referring to FIGS. 8A to 8C, a 3D image sensor 1100d or 1100e according to an exemplary embodiment of the present inventive concept may differ from the 3D image sensor 1100 of FIG. 1A in that a pixel 100d or 100e further includes a low photogate 115l or a high photogate 115h arranged in a central portion thereof. For example, in the 3D image sensor 1100d or 1100e, a photogate 110, storage and transmission gates 120 to 170, and an overflow gate 180 may be arranged in the pixel 100d or 100e to have similar structures to those of the 3D image sensor 1100 of FIG. 1A. However, unlike the 3D image sensor 1100 of FIG. 1A, the low photogate 115l or the high photogate 115h may be arranged in the central portion of the pixel 100d or 100e and surrounded by four photogates 110-1, 110-2, 110-3, and 110-4.

Of a high voltage and a low voltage applied to the photogate 110, the low voltage may be applied to the low photogate 115l. For example, when the high voltage and the low voltage applied to the photogate 110 are about 1 V and about 0 V, respectively, a voltage of about 0 V may be applied to the low photogate 115l. It is to be understood that the high voltage and the low voltage applied to the photogate 110 and the low voltage applied to the low photogate 115l are not limited to the above-described numerical values.

As shown in FIG. 8B, an n-type doping region may be formed under the low photogate 115l. When the n-type doping region is formed as described above on the basis of n-type metal-oxide-semiconductor (NMOS), an energy level may be formed as illustrated with a dashed line, so that a threshold voltage Vth may be reduced. Thus, even if a low voltage $V_{low}$ such as, for example, a voltage of about 0 V, is applied to the low photogate 115l, signal characteristics may be improved similarly to the above-described effects of the middle photogate 115m of the 3D image sensor 1100c of FIG. 7A.

Of a high voltage and a low voltage applied to the photogate 110, the high voltage may be applied to the high photogate 115h. For example, when the high voltage and the low voltage applied to the photogate 110 are about 1 V and about 0 V, respectively, a voltage of about 1 V may be applied to the high photogate 115h. It is to be understood that the high voltage and the low voltage applied to the photogate 110 and the high voltage applied to the high photogate 115h are not limited to the above-described numerical values.

As shown in FIG. 8C, a p-type doping region may be formed under the high photogate 115h. When the p-type doping region is formed as described above on the basis of NMOS, an energy level may be formed as illustrated with a dashed line, so that a threshold voltage Vth may be increased. Thus, when a high voltage $V_{high}$ such as, for example, a voltage of about 1 V, is applied to the high photogate 115h, signal characteristics may be improved similarly to the above-described effects of the middle photogate 115m of the 3D image sensor 1100c of FIG. 7A.

Figure 9A:
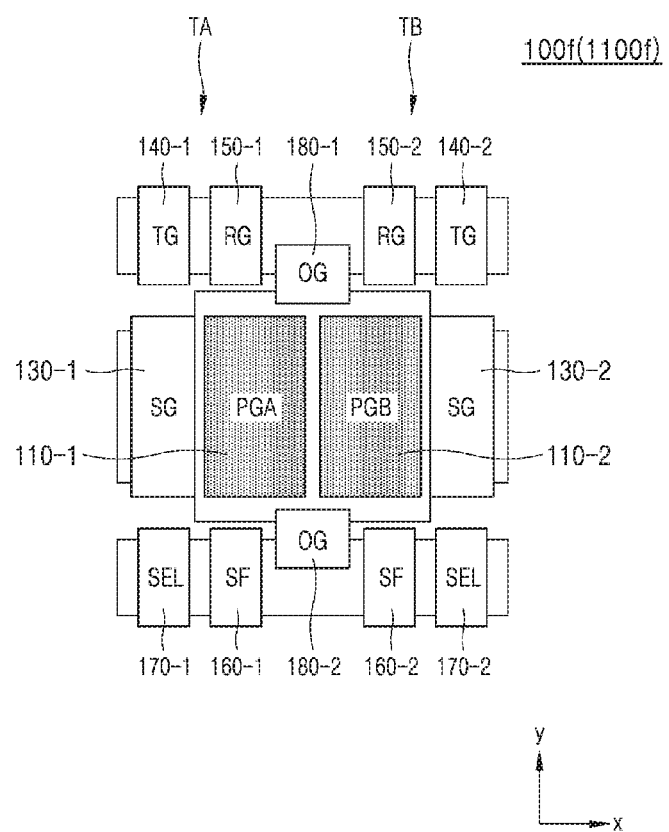
FIG. 9A is a plan view of a 2-tap pixel of a ToF-based 3D image sensor according to an exemplary embodiment of the present inventive concept.
Figure 9B:
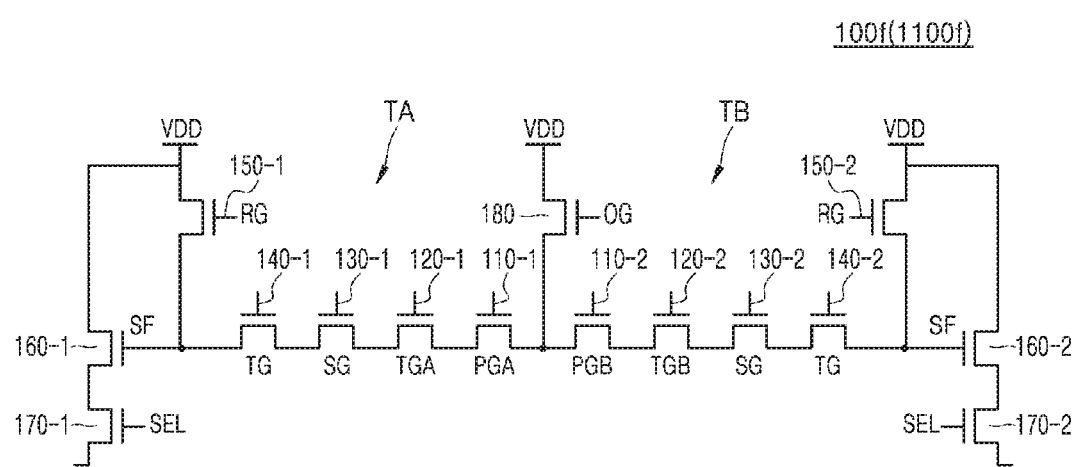
FIG. 9B is a cross-sectional view corresponding to the 2-tap pixel of FIG. 9A.

FIG. 9A is a plan view of a 2-tap pixel of a ToF-based 3D image sensor 1100f according to an exemplary embodiment of the present inventive concept. FIG. 9B is an equivalent circuit diagram corresponding to the 2-tap pixel of FIG. 9A. For convenience of explanation, a further description of elements and technical aspects previously described with reference to FIGS. 1A to 8C may be only briefly presented or may be omitted.

Referring to FIGS. 9A and 9B, in the ToF-based 3D image sensor 1100f according to an exemplary embodiment of the present inventive concept, a pixel 100f may have a 2-tap pixel structure corresponding to a multi-tap pixel structure. Since the pixel 100f has the 2-tap pixel structure, the 3D image sensor 1100f may perform a relatively fast depth sensing operation on an object. The 3D image sensor 1100f may adopt a global shutter method corresponding to a light burst modulation method of a light generator (refer to 1200 in FIG. 12) and include an overflow gate 180 (or OG) configured to discharge and remove an overflow charge. It is to be understood that the 3D image sensor 1100f of FIGS. 9A and 9B is not limited to a light burst modulation method, and may also be applied to a typical light modulation method that does not utilize light burst modulation.

In the 3D image sensor 1100f of FIGS. 9A and 9B, the pixel 100f may include sub-pixels TA and TB corresponding to two taps. Each of the sub-pixels TA and TB may include a photogate 110 configured to generate charges, storage and transmission gates 130 to 170, and an overflow gate 180. The storage and transmission gates 130 to 170 may include, for example, a storage gate 130, a transfer gate 140, a reset gate 150, a source-follower gate 160, and a selection gate 170.

The storage gate 130 may be the same as the storage gate 130 of the 3D image sensor 1100 described with reference to FIG. 1A. As described with reference to FIGS. 3 to 4B, a charge storage structure is not limited to the storage gate 130, and may include a structure having only a storage diode SD or a combined structure of the storage gate 130 and the storage diode SD. When the charge storage structure has the combined structure of the storage gate 130 and the storage diode SD, a tap transfer gate may be omitted. Since FIGS. 9A and 9B illustrate structures from which the tap transfer gate is omitted, it can be inferred that the storage diode SD is formed under the storage gate 130.

Hereinafter, reference numeral '1' will be used to denote gates included in a first sub-pixel TA, and reference numeral '2' will be used to denote gates included in a second sub-pixel TB. For example, the first sub-pixel TA may include a first photogate 110-1, a first storage gate 130-1, a first transfer gate 140-1, a first reset gate 150-1, a first source-follower gate 160-1, a first selection gate 170-1, and a first overflow gate 180-1.

In the ToF-based 3D image sensor 1100f of FIGS. 9A and 9B, the first and second sub-pixels TA and TB of the pixel 100f may have a symmetrical structure on an x-y plane. For example, assuming that the x-y plane is divided into two regions along a y-axis, as shown in FIG. 9A, the first sub-pixel TA may be arranged in a left region, the second sub-pixel TB may be arranged in a right region, and the first and second sub-pixels TA and TB may have a symmetrical structure about the y-axis.

For example, assuming that the first sub-pixel TA corresponds to taps having phases of 0° and 90°, the second sub-pixel TB may correspond to taps having phases of 180° and 270°, and the gates included in the first sub-pixel TA may be symmetric to the gates included in the second sub-pixel TB about the y-axis of the x-y plane. For example, the first photogate 110-1 and the second photogate 110-2 may be arranged adjacent to the y-axis in the left region and the right region, respectively. The first storage gate 130-1 and the second storage gate 130-2 may be respectively arranged adjacent to the first photogate 110-1 and the second photogate 110-2 in outer portions of the left and right regions. The first transfer gate 140-1 and the first reset gate 150-1 may be arranged in an upper portion of the left region in the x direction, and the second transfer gate 140-2 and the second reset gate 150-2 may be arranged in an upper portion of the right region in the x direction.

Further, the first selection gate 170-1 and the first source-follower gate 160-1 may be arranged in a lower portion of the left region in the x direction, and the second selection gate 170-2 and the second source-follower gate 160-2 may be arranged in a lower portion of the right region in the x direction. The first overflow gate 180-1 may be arranged above the photogate 110 between the left region and the right region, and the second overflow gate 180-2 may be arranged below the photogate 110 between the left region and the right region. As a result, the gates of the first sub-pixel TA may be symmetrical to the gates of the second sub-pixel TB about the y-axis of the x-y plane.

Since the pixel 100f includes the 2-tap pixel structure and the overflow gate 180, the 3D image sensor 1100f of FIGS. 9A and 9B may adopt the light burst modulation method. As a result, the influence of external light may be minimized or reduced, and a demodulation operation time may be minimized or reduced. In the 3D image sensor 1100f, the photogate 110, the storage and transmission gates 130 to 170, and the overflow gate 180 of the pixel 100f may have a symmetrical structure to realize tap symmetry. Thus, excellent signal transmission characteristics may be obtained without distortion or deformation of signals. Furthermore, the 3D image sensor 1100f may include the charge storage structure between the photogate 110 and the transfer gate 140, which may minimize or reduce read noise.

Referring to FIG. 9A, when the pixel 100f has a 2-tap pixel structure, two photogates 110-1 and 110-2 and two overflow gates 180-1 and 180-2 may be symmetrically arranged about a straight line passing through a center of the pixel 100f. The straight line may extend in a direction substantially parallel with the x-axis or substantially parallel with the y-axis. The photogates 110 and overflow gates 180 in such a configuration that form a 2-tap pixel structure may be referred to as having a symmetrical structure about a straight line passing through a center of the pixel 100f.

Figure 10A:
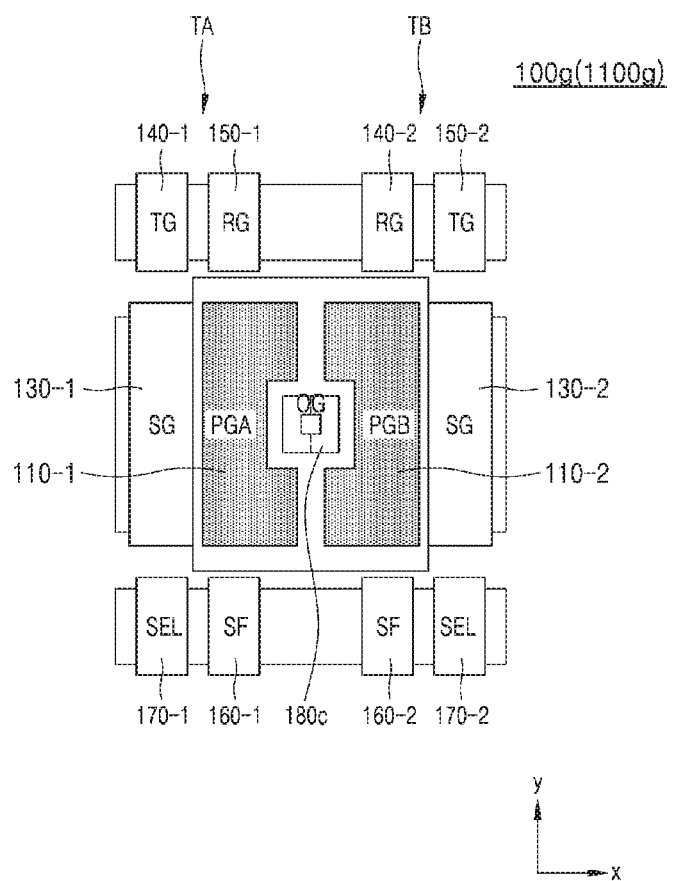
FIGS. 10A to 10C are plan views of a 2-tap pixel of a ToF-based 3D image sensor according to exemplary embodiments of the present inventive concept.
Figure 10B:
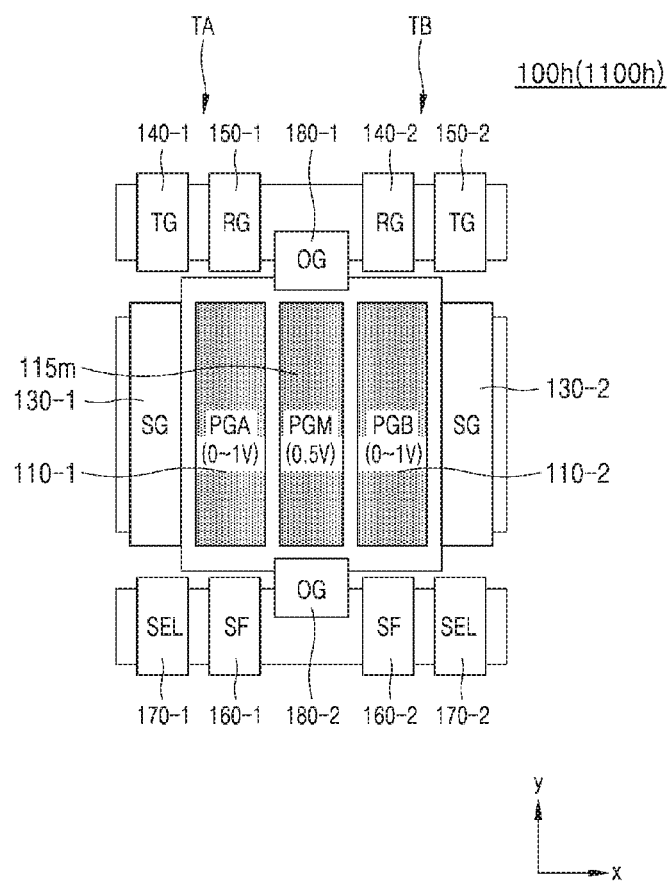
Figure 10C:
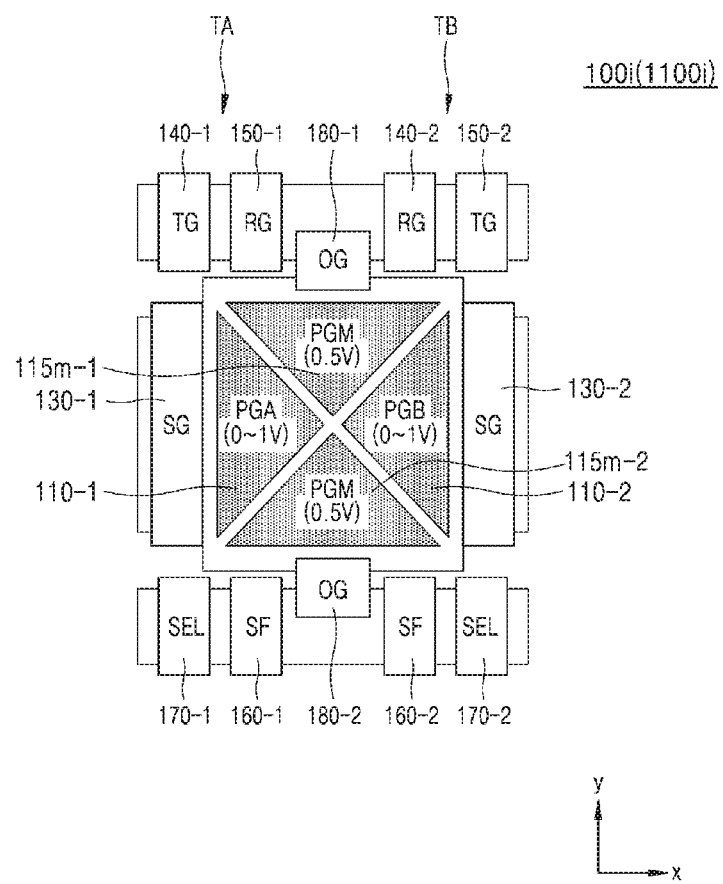

FIGS. 10A to 10C are plan views of a 2-tap pixel of a ToF-based 3D image sensor according to exemplary embodiments of the present inventive concept. For convenience of explanation, a further description of elements and technical aspects previously described with reference to FIGS. 1A to 9B may be only briefly presented or may be omitted.

Referring to FIG. 10A, a 3D image sensor 1100g according to an exemplary embodiment of the present inventive concept may differ from the 3D image sensor 1100f of FIG. 9A in that an overflow gate 180c is arranged in a central portion of an x-y plane of a pixel 100g. For example, in the 3D image sensor 1100g of FIG. 10A, sub-pixels TA and TB corresponding to two taps may be arranged in two regions of the x-y plane, which are divided by a y-axis. The photogates 110 and the storage and transmission gates 130 to 170, which are included in the respective sub-pixels TA and TB, may be arranged to have a symmetrical structure about the y-axis of the x-y plane.

In the 3D image sensor 1100g of FIG. 10A, the overflow gate 180c may be arranged in a center of the pixel 100g (e.g., a center of the x-y plane). Thus, the overflow gate 180c may be surrounded by two photogates 110-1 and 110-2. In FIG. 10A, the overflow gate 180c is illustrated as being divided into two portions by dashed lines, which indicates that one overflow gate 180c has a symmetrical structure about the y-axis. In exemplary embodiments, one overflow gate 180c may be formed in the center of the x-y plane, and a structure of a gate electrode may be formed on a substrate to be symmetrical about the y-axis.

Referring to FIG. 10B, a 3D image sensor 1100h according to an exemplary embodiment of the present inventive concept may differ from the 3D image sensor 1100f of FIG. 9A in that a pixel 100h further includes a middle photogate 115m arranged in a central portion thereof. For example, in the 3D image sensor 1100h of FIG. 10B, a photogate 110, storage and transmission gates 130 to 170, and an overflow gate 180 may be arranged in the pixel 100h to have similar structures to those of the 3D image sensor 1100f of FIG. 9A. However, unlike the 3D image sensor 1100f of FIG. 9A, the middle photogate 115m may be arranged between two photogates 110-1 and 110-2 in the central portion of the pixel 100h.

A voltage having a middle level between a high voltage and a low voltage applied to the photogate 110 may be applied to the middle photogate 115m. Effects of the middle photogate 115m may be the same as described with reference to the 3D image sensor 1100c of FIG. 7A. In exemplary embodiments, a low photogate or a high photogate may be utilized instead of the middle photogate 115m. When a low photogate is utilized instead of the middle photogate 115m, an n-type doping region may be formed under the low photogate, and a low voltage may be applied to the low photogate. When a high photogate is utilized instead of the middle photogate 115m, a p-type doping region may be formed under the high photogate, and a high voltage may be applied to the high photogate. Effects of the low photogate and the high photogate may be the same as described with reference to the image sensor 1100d or 1100e of FIG. 8A.

Referring to FIG. 10C, a 3D image sensor 1100i according to an exemplary embodiment of the present inventive concept may differ from the 3D image sensor 1100h of FIG. 10B in that a pixel 100i includes two middle photogates 115m-1 and 115m-2, and a photogate 110 has a triangular structure. For example, in the 3D image sensor 1100i of FIG. 10C, two photogates 110-1 and 110-2 and two middle photogates 115m-1 and 115m-2 may have triangular structures and have a symmetrical structure about a center of an x-y plane. Storage and transmission gates 130 to 170 and an overflow gate 180 may have a symmetrical structure about the y-axis. One overflow gate 180 may be arranged above a first middle photogate 115m-1, and one overflow gate 180 may be arranged below a second middle photogate 115m-2.

In the 3D image sensor 1100i of FIG. 10C, middle photogates 115m and photogates 110 arranged in a central portion of the pixel 100i may be symmetrically arranged about the center of the x-y plane. As a result, uniform signal characteristics may be obtained. Effects of the middle photogates 115m may be the same as in the 3D image sensor 1100c described with reference to FIG. 7A. In exemplary embodiments, the middle photogates 115m may be replaced with low photogates or high photogates. In this case, effects of the low photogates or the high photogates may be the same as in the image sensor 1100d or 1100e described with reference to FIG. 8A.

Figure 11A:
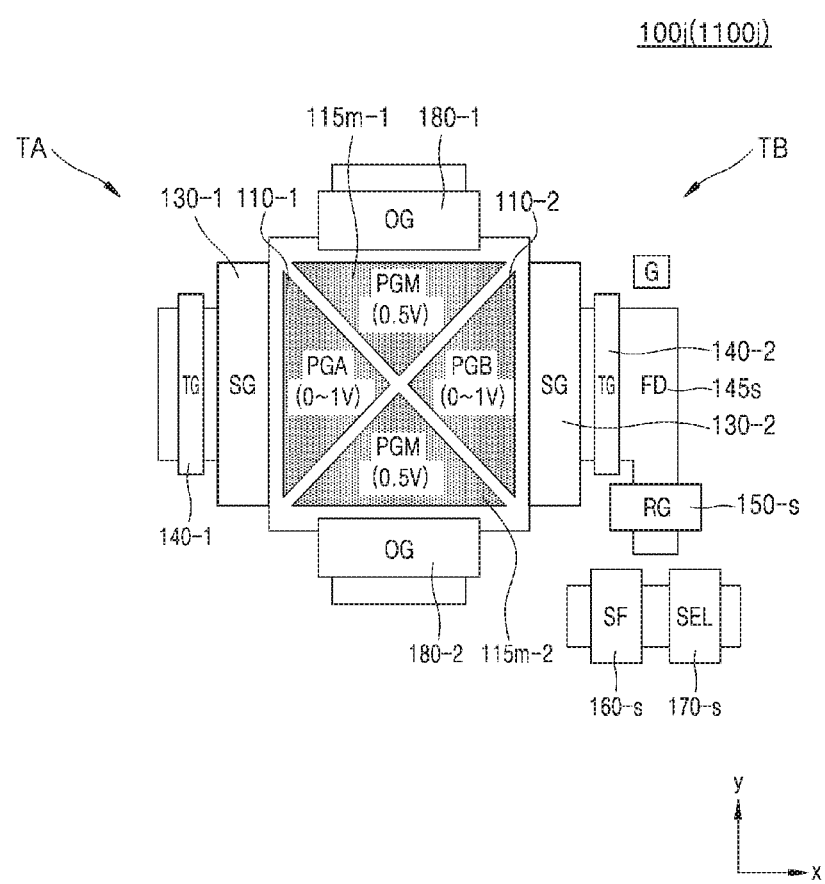
FIG. 11A is a plan view of a 2-tap pixel of a ToF-based 3D image sensor according to an exemplary embodiment of the present inventive concept.
Figure 11B:
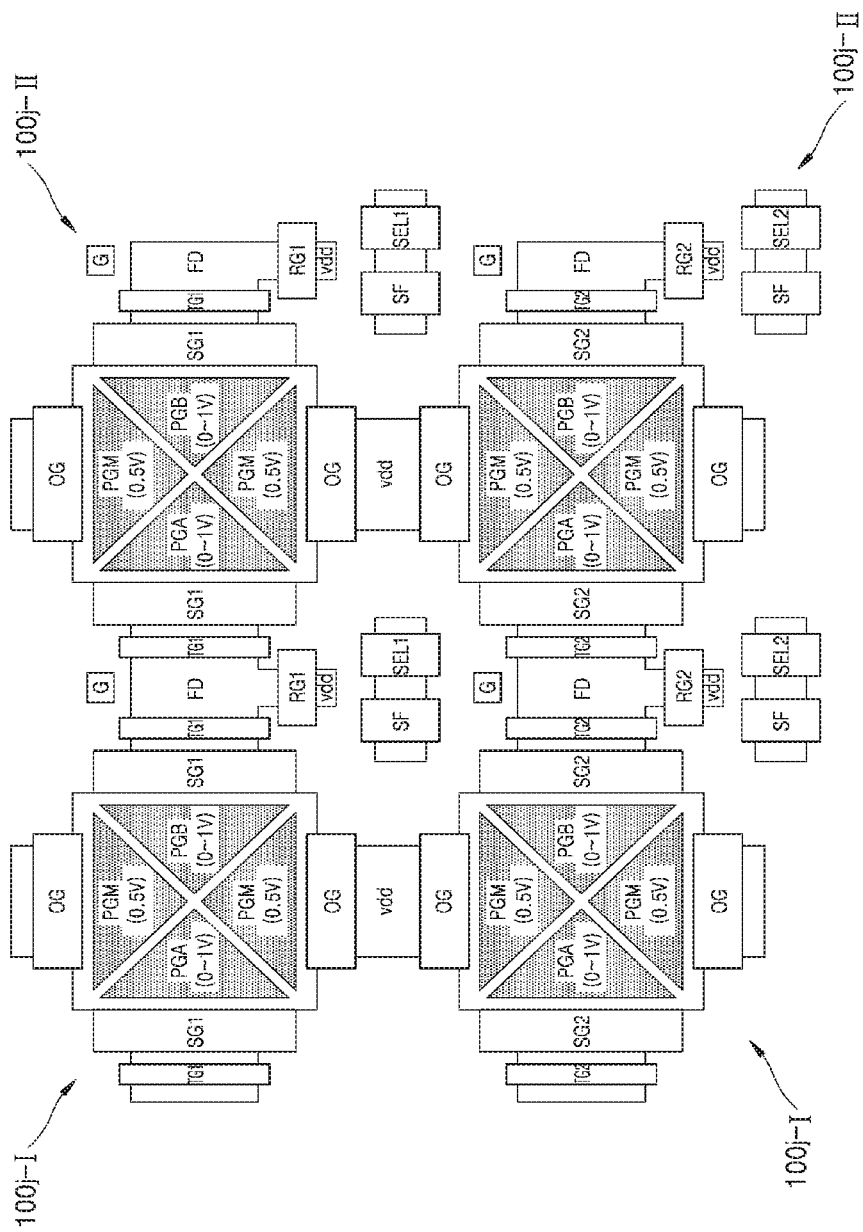
FIG. 11B is a plan view of a structure in which four 2-tap pixels of FIG. 11A are arranged adjacent to one another.
Figure 11C:
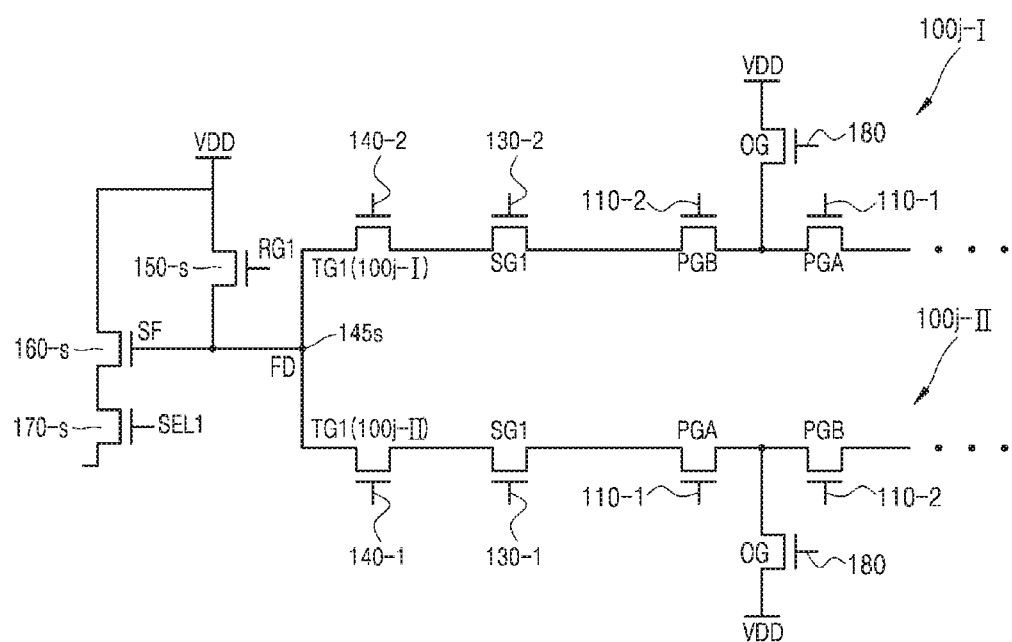
FIG. 11C is an equivalent circuit diagram of a portion of the structure of FIG. 11B.

FIG. 11A is a plan view of a 2-tap pixel of a ToF-based 3D image sensor according to an exemplary embodiment of the present inventive concept. FIG. 11B is a plan view of a structure in which four 2-tap pixels of FIG. 11A are arranged adjacent to one another. FIG. 11C is an equivalent circuit diagram of a portion of the structure of FIG. 11B. For convenience of explanation, a further description of elements and technical aspects previously described with reference to FIGS. 1A to 10C may be only briefly presented or may be omitted.

Referring to FIGS. 11A to 11C, in a 3D image sensor 1100j according to an exemplary embodiment of the present inventive concept, a pixel 100j may include two sub-pixels TA and TB. Of storage and transmission gates, a reset gate 150-s, a source-follower gate 160-s, and a selection gate 170-s may be shared between the corresponding sub-pixels of two pixels 100j-I and 100j-II. For example, in the 3D image sensor 1100j of FIGS. 11A to 11C, the sub-pixels TA and TB of the pixel 100j and photogates 110-1 and 110-2, storage gates 130-1 and 130-2, and transfer gates 140-1 and 140-2, which correspond to the sub-pixels TA and TB of the pixel 100j, may be arranged in an x-y plane to have a symmetrical structure about the y-axis.

In addition, the 3D image sensor 1100j of FIGS. 11A to 11C may include two middle photogates 115m-1 and 115m-2, similar to the 3D image sensor 1100j of FIG. 10C. As a result, the photogates 110-1 and 110-2 and the middle photogates 115m-1 and 115m-2 may have a symmetrical structure about a center of the x-y plane. In FIGS. 11A to 11C, the illustration of a tap transfer gate is omitted. As described above, according to exemplary embodiments, the tap transfer gate may or may not be included in the pixel 100j. As in the 3D image sensor 1100i of FIG. 10C, one overflow gate 180 may be arranged above a first middle photogate 115m-1, and one overflow gate 180 may be arranged below a second middle photogate 115m-2. However, it is to be understood that the overflow gate 180 is not limited thereto, and may be arranged in a central portion of the pixel 100j and surrounded by the photogates 110-1 and 110-2 and the middle photogates 115m-1 and 115m-2, similar to the pixel 100a of the 3D image sensor 1100a of FIG. 5A. The photogate 110 and/or the middle photogate 115m may be arranged to have the same structure as in FIGS. 9A, 10A, and 10B.

An FD region 145s may be arranged on the right side of the transfer gate 140-2, and the reset gate 150-s may be arranged under the FD region 145s in the y direction. The source-follower gate 160-s and the selection gate 170-s may be arranged under the reset gate 150-s in the y direction and arranged substantially in parallel in the x direction. As can be seen from FIG. 11C, the FD region 145s, the reset gate 150-s, the source-follower gate 160-s, and the selection gate 170-s may also be arranged on the left side of the transfer gate 140-1.

According to exemplary embodiments, the reset gate 150-s, the source-follower gate 160-s, and the selection gate 170-s are not arranged one by one to correspond to each of the sub-pixels TA and TB, but rather, are shared between the corresponding sub-pixels of two pixels. The FD region 145s may be shared between the corresponding sub-pixels of the two pixels. For example, as can be seen from FIGS. 11B and 11C, the FD region 145s may be shared between sub-pixels TB and TA of two pixels 100j-I and 100j-II. The sub-pixels TB and TA, which may share the FD region 145s with each other, may correspond to a tap having the same phase.

The reset gate 150-s arranged under the FD region 145s may be connected to the FD region 145s and shared between the sub-pixels TB and TA, and the source-follower gate 160-s and the selection gate 170-s arranged under the reset gate 150-s may be shared between the sub-pixels TB and TA. In exemplary embodiments, positions of the reset gate 150-s, the source-follower gate 160-s, and the selection gate 170-s, which are shared between the sub-pixels TB and TA, may be changed. For example, the reset gate 150-s, the source-follower gate 160-s, and the selection gate 170-s may be arranged above the FD region 145s and shared between the sub-pixels TB and TA.

Figure 12:
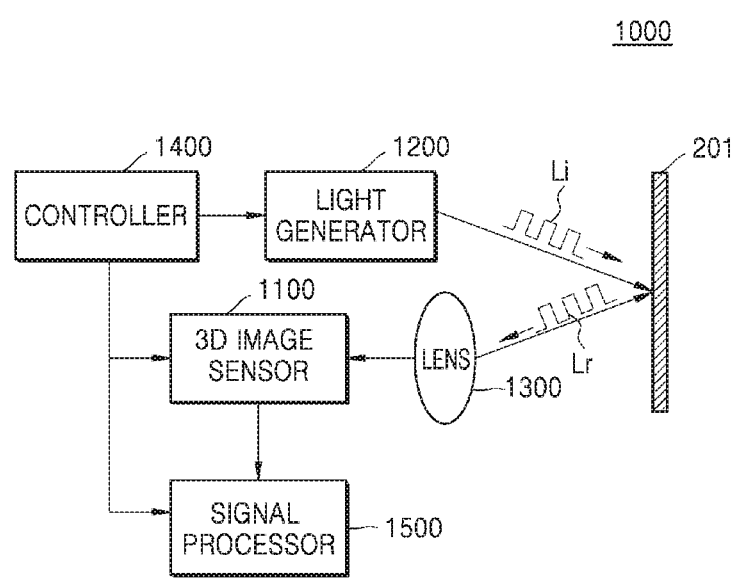
FIG. 12 is a diagram of an electronic apparatus including a 3D image sensor according to an exemplary embodiment of the present inventive concept.

FIG. 12 is a diagram of an electronic apparatus 1000 including a 3D image sensor 1100 according to an exemplary embodiment of the present inventive concept. For convenience of explanation, a further description of elements and technical aspects previously described with reference to FIGS. 1A to 11C may only be briefly presented or may be omitted.

Referring to FIG. 12, the electronic apparatus 1000 may include the 3D image sensor 1100 (also referred to as a 3D image sensor circuit), a light generator 1200 (also referred to as a light generator circuit), a lens 1300, a controller 1400 (also referred to as a controller circuit), and a signal processor 1500 (also referred to as a signal processor circuit). The 3D image sensor 1100 may be, for example, the 3D image sensor 1100 of FIG. 1A. However, exemplary embodiments of the present inventive concept are not limited thereto. For example, according to exemplary embodiments, all of the 3D image sensors described herein, including the 3D image sensors 1100a to 1100j of FIGS. 2A, 3, 4A, 5A, 6A, 7A, 8A, 9A, 10A, and 11A, may be utilized in the electronic apparatus 1000.

The light generator 1200 may generate light, and an object 201 may be irradiated with the light. The light generator 1200 may generate, for example, infrared (IR) light, near infrared (NIR) light, ultraviolet (UV) light, or visible light, and emit the generated light toward the object 201 to irradiate the object 201 with the generated light. The light generator 1200 may be implemented, for example, as a light-emitting diode (LED) array or a laser apparatus. As described above, the light generator 1200 may generate and emit light Li, which is modulated using a light burst modulation method, toward the object 201.

The lens 1300 may condense light Lr reflected by the object 201 and transmit the condensed light to the 3D image sensor 1100. The controller 1400 may control all of the 3D image sensor 1100, the light generator 1200, and the signal processor 1500. The signal processor 1500 may generate a depth image (e.g., a 3D image) of the object 201 using a signal processing module based on the amounts of charges obtained by measuring charges generated by the 3D image sensor 1100 at different phases using a ToF method.

While the present inventive concept has been particularly shown and described with reference to the exemplary embodiments thereof, it will be understood that various changes in form and detail may be made therein without departing from the spirit and scope of the present inventive concept as defined by the following claims.

What is claimed is:

1. A Time-of-Flight (ToF)-based three-dimensional (3D) image sensor, comprising:
    at least two first photogates symmetrically arranged in a central portion of a pixel;
    at least two first gates configured to remove an overflow charge generated in the at least two first photogates, wherein the at least two first gates are arranged symmetrically in an outer portion of the pixel and are spaced apart from the at least two first photogates in a plan view; and
    a first gate group comprising a plurality of gates configured to store and transmit charges generated in the at least two first photogates, wherein the first gate group is arranged in the outer portion of the pixel.

2. The ToF-based 3D image sensor of claim 1, wherein the pixel has a 2-tap pixel structure comprising two first photogates or a 4-tap pixel structure comprising four first photogates,
    the two first photogates and two first gates of the at least two first gates are symmetrically arranged about a straight line passing through a center of the pixel when the pixel has the 2-tap pixel structure, and
    the four first photogates and four first gates of the at least two first gates are symmetrically arranged about the center of the pixel when the pixel has the 4-tap pixel structure.

3. The ToF-based 3D image sensor of claim 1, wherein a charge storage structure is arranged between the at least two first photogates and a floating diffusion (FD) region.

4. The ToF-based 3D image sensor of claim 3,
    wherein the charge storage structure comprises a storage diode structure, a storage gate structure, or a combined structure comprising a storage diode and a storage gate, wherein the storage diode is formed under the storage gate in the combined structure.

5. The ToF-based 3D image sensor of claim 1, further comprising:
    a second photogate arranged in the central portion of the pixel between the at least two first photogates.

6. The ToF-based 3D image sensor of claim 5, wherein a middle voltage between a high voltage and a low voltage applied to at least one of the at least two first photogates is applied to the second photogate, or
    an n-type or p-type doping region is formed under the second photogate, and the low voltage or the high voltage is applied to the second photogate.

7. The ToF-based 3D image sensor of claim 1, wherein the pixel has a 4-tap pixel structure comprising four first photogates,
    the four first photogates are respectively arranged in four quadrants that are divided by an x-axis and a y-axis, and
    four first gates of the at least two first gates are each arranged between two quadrants outside the first photogates.

8. The ToF-based 3D image sensor of claim 1, wherein the pixel has a 2-tap pixel structure comprising the at least two first photogates,
    the at least two first photogates are arranged on both sides of a straight line passing through a center of the pixel, and
    the at least two first gates are respectively arranged above and below the at least two first photogates between the at least two first photogates in the outer portion of the pixel.

9. The ToF-based 3D image sensor of claim 8, further comprising:
    at least one second photogate arranged in the central portion of the pixel between the at least two first photogates.

10. A Time-of-Flight (ToF)-based three-dimensional (3D) image sensor, comprising:
    at least two photogates symmetrically arranged in a central portion of a pixel;
    a first gate configured to remove an overflow charge generated in the at least two photogates, wherein the first gate is surrounded by the at least two photogates, is arranged as a symmetrical structure in the central portion of the pixel, and is spaced apart from the at least two photogates in a plan view; and
    a gate group comprising a plurality of gates configured to store and transmit charges generated in the at least two photogates, wherein the gate group is arranged in an outer portion of the pixel.

11. The ToF-based 3D image sensor of claim 10, wherein the pixel has a 2-tap pixel structure comprising two photogates or a 4-tap pixel structure comprising four photogates,
    the two photogates are symmetrically arranged about a straight line passing through a center of the pixel when the pixel has the 2-tap pixel structure, and
    the four photogates are symmetrically arranged about the center of the pixel when the pixel has the 4-tap pixel structure.

12. The ToF-based 3D image sensor of claim 10, wherein the pixel has a 4-tap pixel structure comprising four photogates,
    the four photogates are respectively arranged in four quadrants that are divided by an x-axis and a y-axis,
    the first gate is arranged in a center of the pixel and surrounded by the four photogates, and the gate group is arranged in a quadrant in which a corresponding photogate is arranged, or is shared by the photogates of four pixels adjacent to a floating diffusion (FD) region that is surrounded by the four pixels.

13. The ToF-based 3D image sensor of claim 10, wherein the pixel has a 2-tap pixel structure comprising the at least two photogates,
the at least two photogates are arranged on both sides of a straight line passing through a center of the pixel,
the first gate is arranged in the center of the pixel and surrounded by the at least two photogates, and
the gate group is arranged adjacent to a corresponding photogate or arranged around a floating diffusion (FD) region arranged between two pixels, and the gate group is shared between the photogates of the two pixels adjacent to the FD region.

14. A Time-of-Flight (ToF)-based three-dimensional (3D) image sensor, comprising:
at least two first photogates symmetrically arranged in a central portion of a pixel;
a first gate configured to emit an overflow charge generated in the at least two first photogates, wherein the first gate is arranged as a symmetrical structure in the central portion or an outer portion of the pixel, and the first gate is spaced apart from the at least two first photogates in a plan view; and
a gate group comprising a plurality of gates configured to store and transmit charges generated in the at least two first photogates, wherein the gate group is arranged in the outer portion of the pixel.

15. The ToF-based 3D image sensor of claim 14, wherein the first gate is arranged in the central portion of the pixel, or the first gate and at least one additional first gate are arranged in the outer portion of the pixel.

16. The ToF-based 3D image sensor of claim 14, wherein the pixel has a 2-tap pixel structure comprising two first photogates,
the first gate and an additional first gate are arranged in the outer portion of the pixel between the two first photogates, or the first gate is arranged in a center of the pixel and surrounded by the two first photogates, and
the ToF-based 3D image sensor further comprises at least one second photogate arranged in the central portion of the pixel between the two first photogates when the first gate and the additional first gate are arranged in the outer portion of the pixel.

17. The ToF-based 3D image sensor of claim 16, wherein the gate group is arranged adjacent to a corresponding first photogate or arranged around a floating diffusion (FD) region arranged between two pixels, and the gate group is shared between the first photogates of the two pixels adjacent to the FD region.

18. The ToF-based 3D image sensor of claim 14, wherein the pixel has a 4-tap pixel structure comprising four first photogates,
the four first photogates are respectively arranged in four quadrants that are divided by an x-axis and a y-axis,
the first gate and three additional first gates are each arranged between two quadrants in the outer portion of the pixel, or the first gate is arranged in a center of the pixel and surrounded by the four first photogates, and
the ToF-based 3D image sensor further comprises a second photogate arranged in the central portion of the pixel between the at least two first photogates when the first gate and the three additional first gates are arranged in the outer portion of the pixel.

19. The ToF-based 3D image sensor of claim 18, wherein the gate group is arranged in a quadrant in which a corresponding first photogate is arranged, or shared among first photogates of four pixels adjacent to a floating diffusion (FD) region that is surrounded by the four pixels.

20. The ToF-based 3D image sensor of claim 14, wherein a charge storage structure is arranged between the at least two first photogates and a floating diffusion (FD) region,
wherein the charge storage structure comprises a storage diode structure, a storage gate structure, or a combined structure comprising a storage diode and a storage gate.

* * * * *